(12) United States Patent
Wakisaka et al.

(10) Patent No.: US 7,888,238 B2
(45) Date of Patent: Feb. 15, 2011

(54) METHOD OF MANUFACTURING SEMICONDUCTOR DEVICE HAVING SEMICONDUCTOR FORMATION REGIONS OF DIFFERENT PLANAR SIZES

(75) Inventors: Shinji Wakisaka, Hanno (JP); Norihiko Kaneko, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 17 days.

(21) Appl. No.: 12/330,745

(22) Filed: Dec. 9, 2008

(65) Prior Publication Data
US 2009/0155982 A1 Jun. 18, 2009

(30) Foreign Application Priority Data
Dec. 12, 2007 (JP) .............................. 2007-320303

(51) Int. Cl.
*H01L 21/00* (2006.01)
(52) U.S. Cl. .................... 438/462; 257/734; 257/737; 438/464; 438/460; 438/113; 438/613
(58) Field of Classification Search ........................ None
See application file for complete search history.

(56) References Cited

U.S. PATENT DOCUMENTS

| 2005/0274702 | A1* | 12/2005 | Deshi ...................... 219/121.72 |
| 2006/0035444 | A1* | 2/2006 | Nakamura et al. .......... 438/464 |
| 2007/0164432 | A1* | 7/2007 | Wakisaka et al. ............ 257/737 |
| 2007/0246826 | A1* | 10/2007 | Chung et al. ................ 257/734 |

FOREIGN PATENT DOCUMENTS

| JP | 2000-150646 | A | | 5/2000 |
| JP | 2004-349461 | A | | 12/2004 |
| JP | 2004349461 | A | * | 12/2004 |
| JP | 2006-173548 | A | | 6/2006 |
| JP | 2007-287780 | A | | 11/2007 |

OTHER PUBLICATIONS

Japanese Office Action dated Sep. 15, 2009 and English translation thereof issued in a counterpart Japanese Application No. 2007-320303.

* cited by examiner

*Primary Examiner*—Ha Tran T Nguyen
*Assistant Examiner*—Shantanu C Pathak
(74) *Attorney, Agent, or Firm*—Holtz, Holtz, Goodman & Chick, PC

(57) ABSTRACT

A wafer process material is prepared which has a plurality of semiconductor formation regions of different planar sizes, each including a low dielectric constant film/wiring line stack structure component. A laser beam is applied onto a dicing street of the necessary semiconductor formation region and onto its straight extension in order to remove partial areas of the low dielectric constant film/wiring line stack structure components of the necessary semiconductor formation region and the unnecessary semiconductor formation region so that first groove and the second groove are formed. A protective film is formed in the second groove formed in the unnecessary semiconductor formation region and on the low dielectric constant film/wiring line stack structure component. An upper wiring line and a sealing film are formed on the protective film, and a semiconductor wafer is cut along the dicing street.

22 Claims, 21 Drawing Sheets

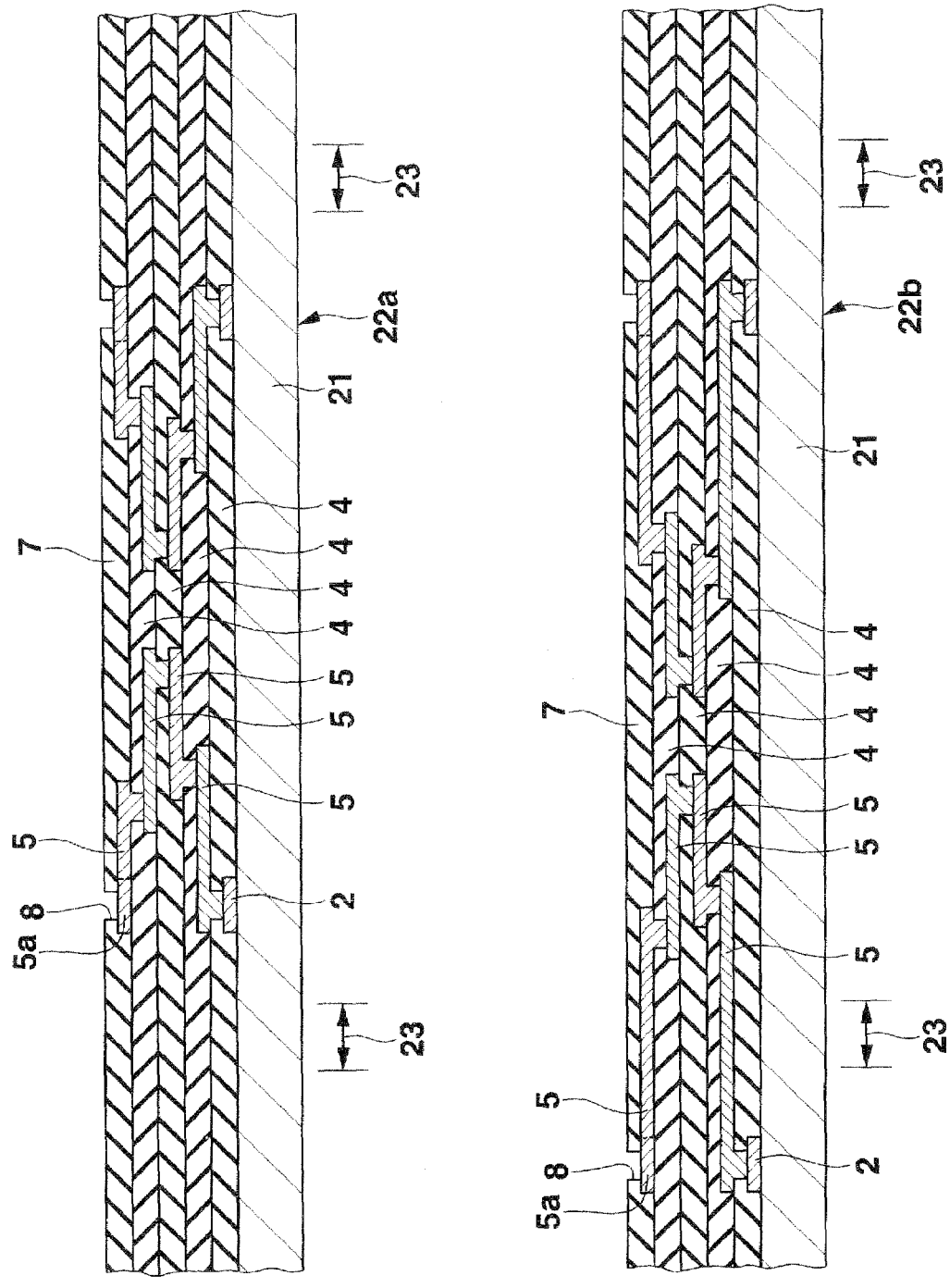

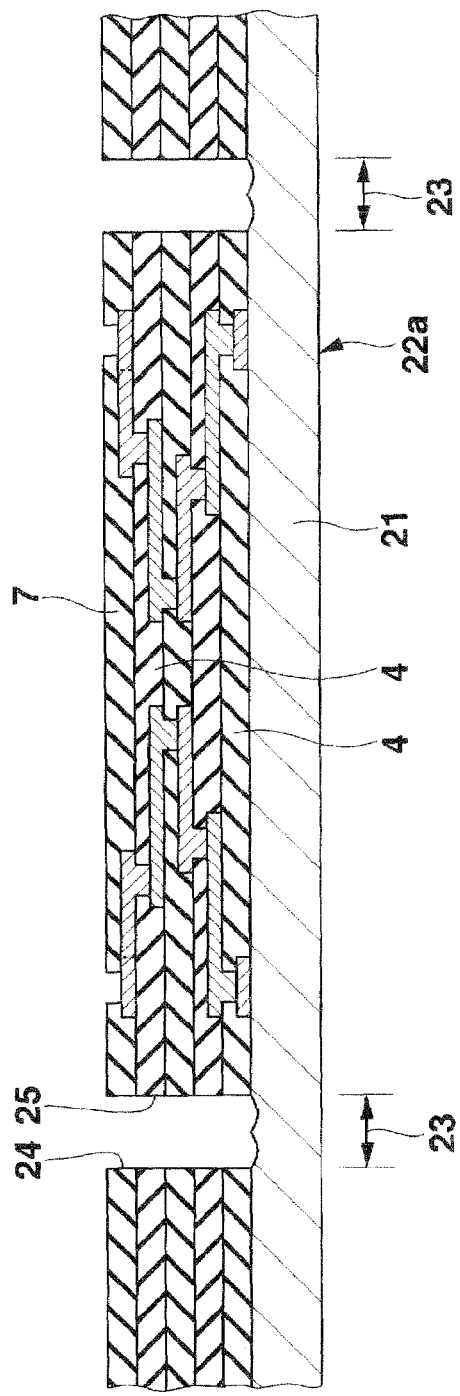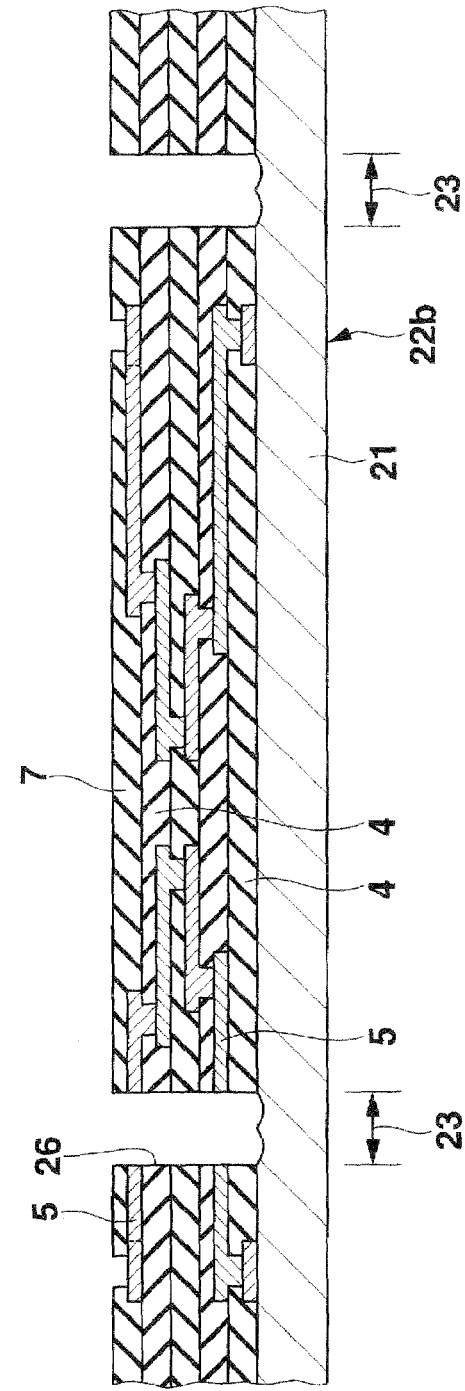

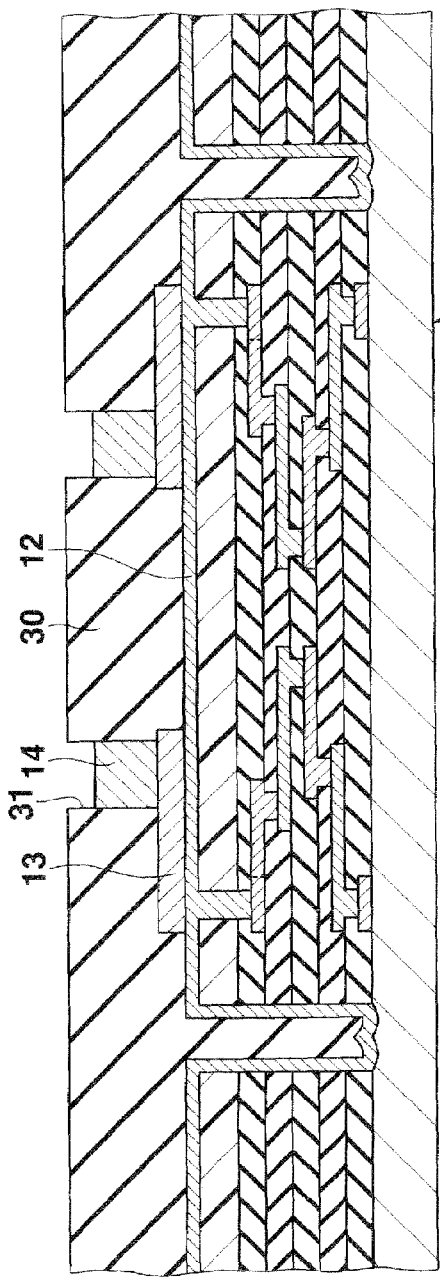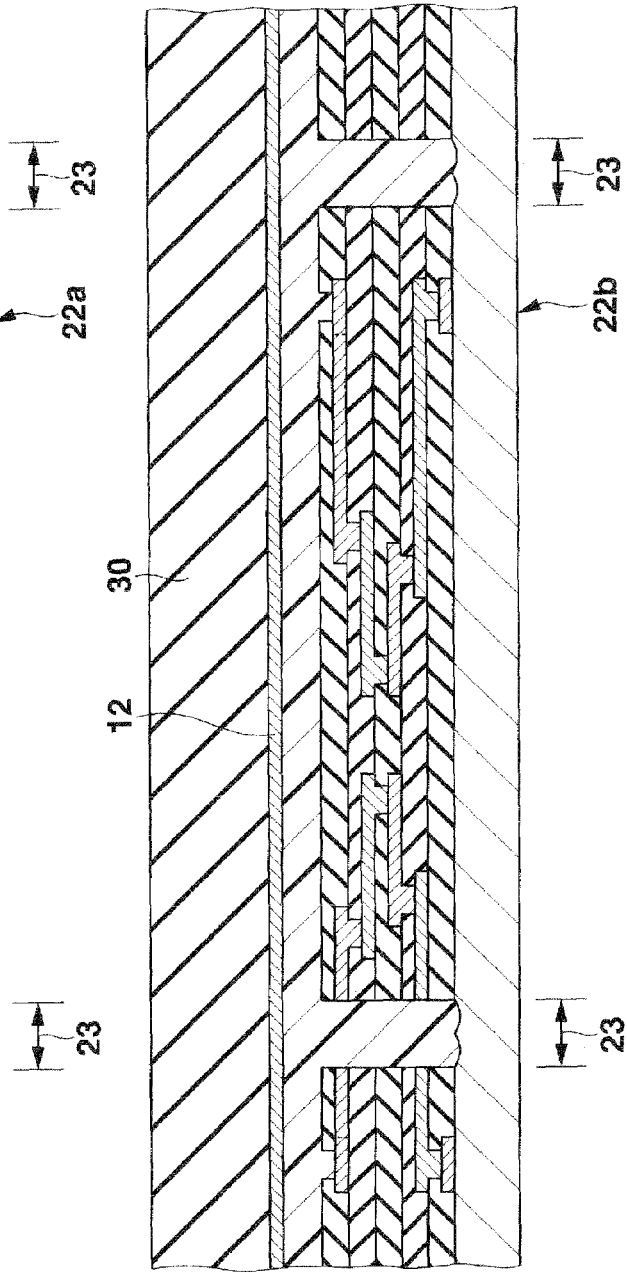
FIG.10A
FIG.10B

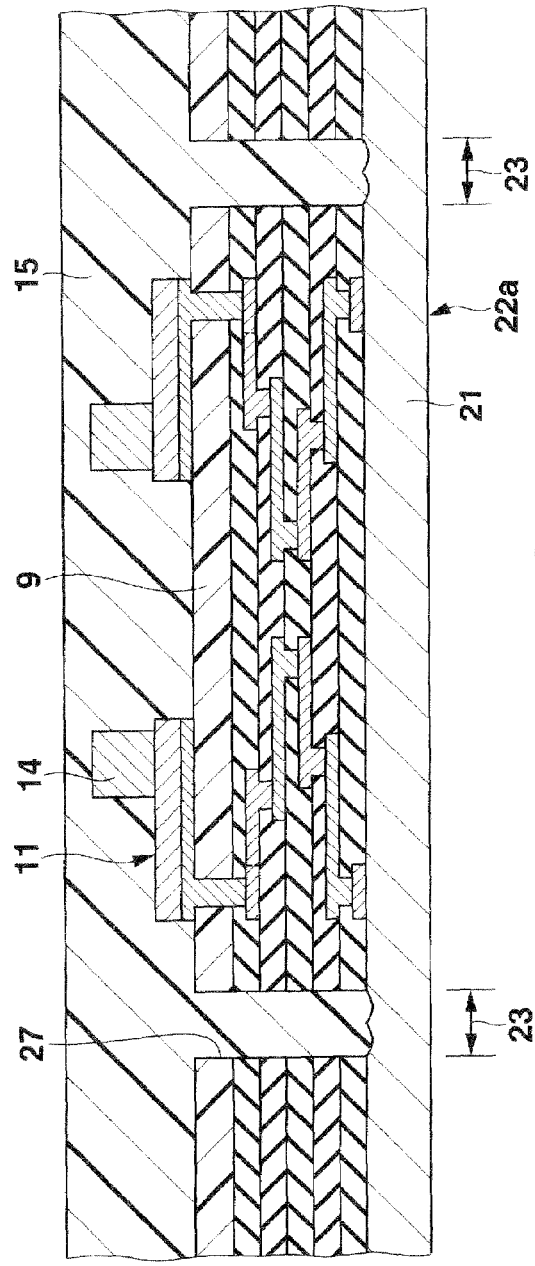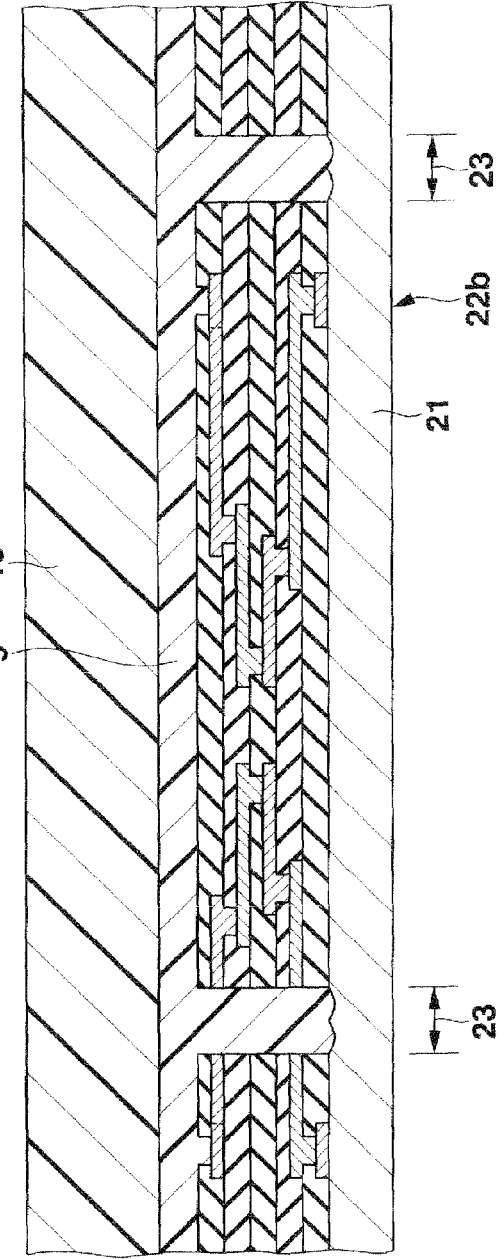
FIG.12A
FIG.12B

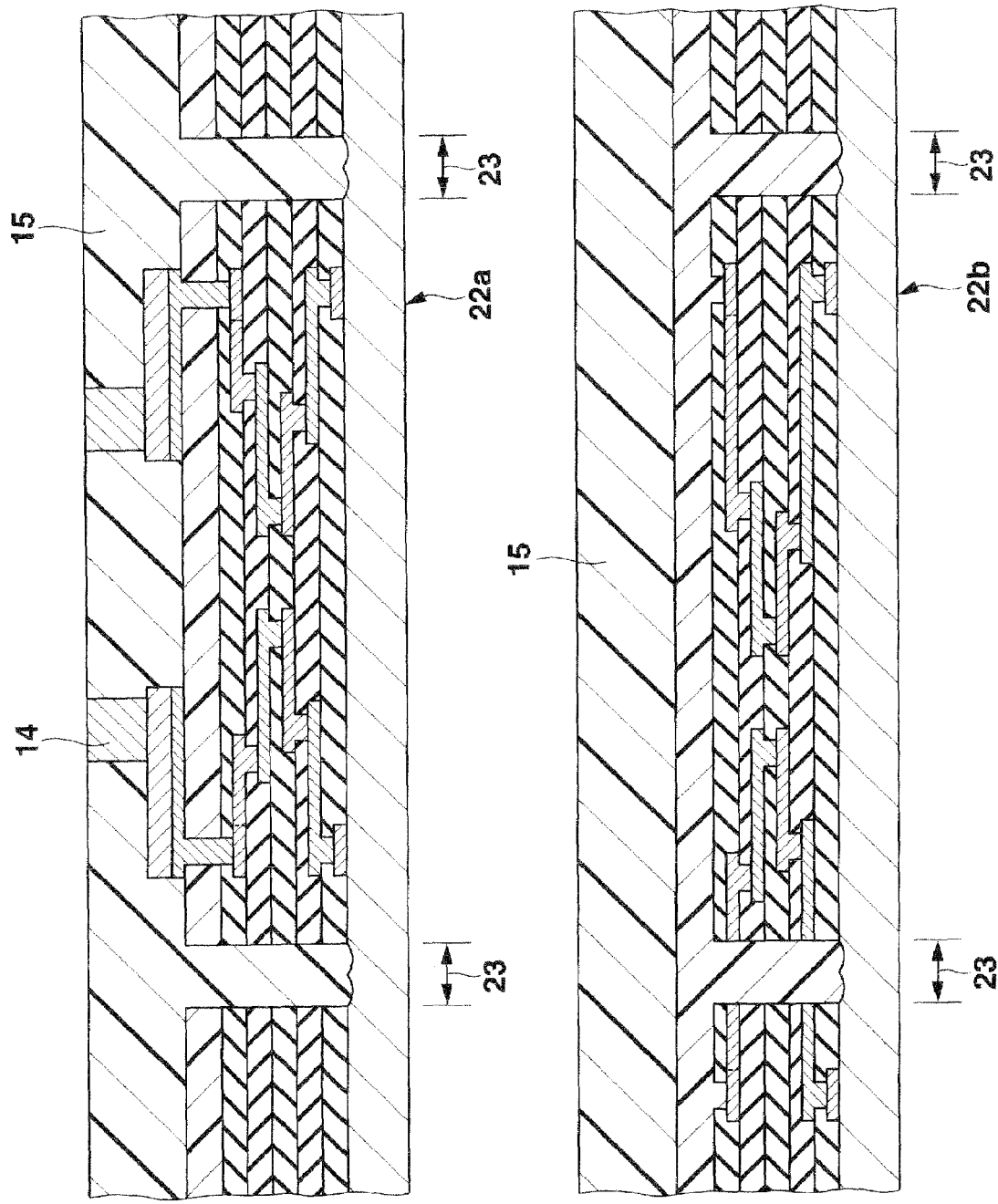

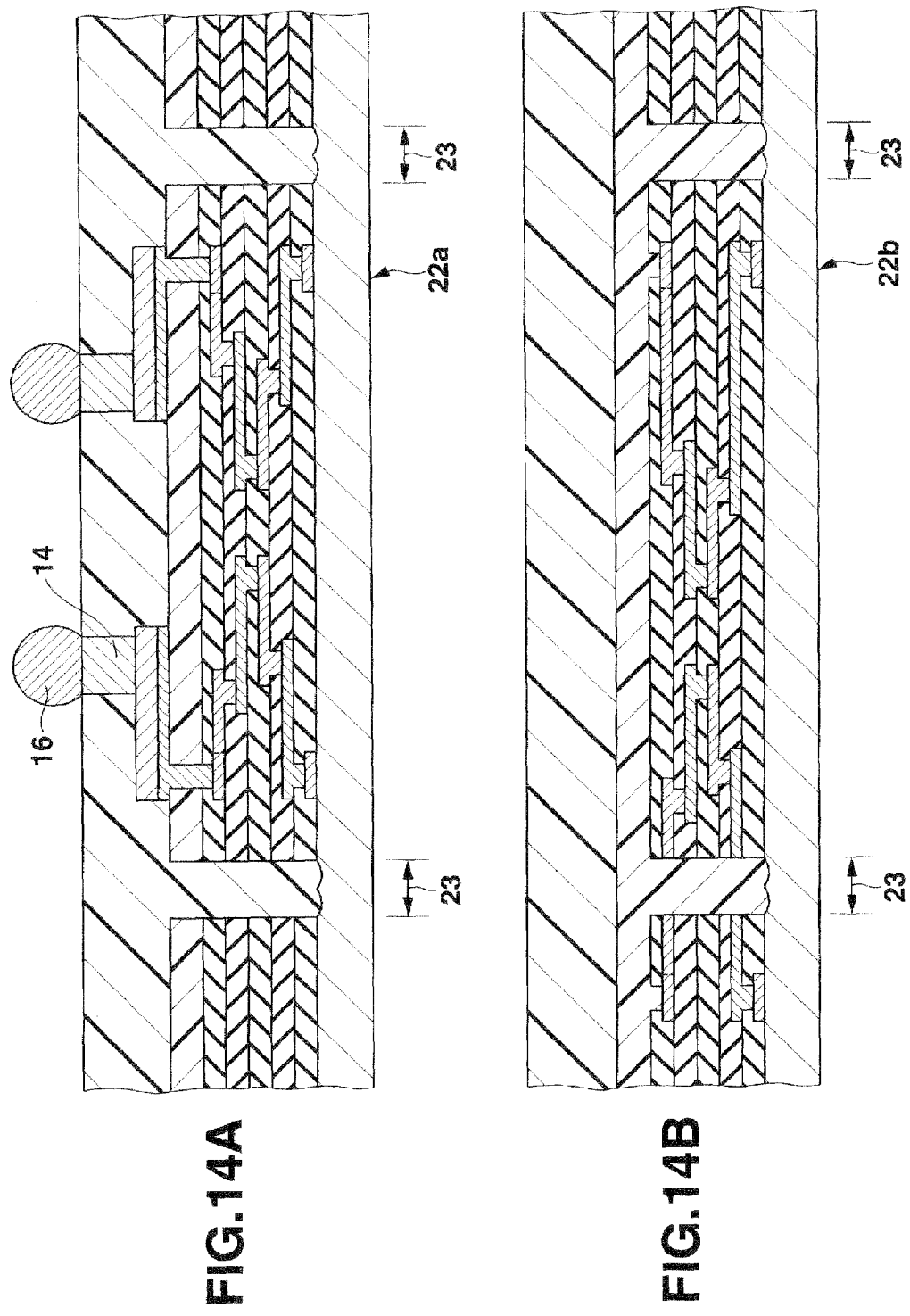

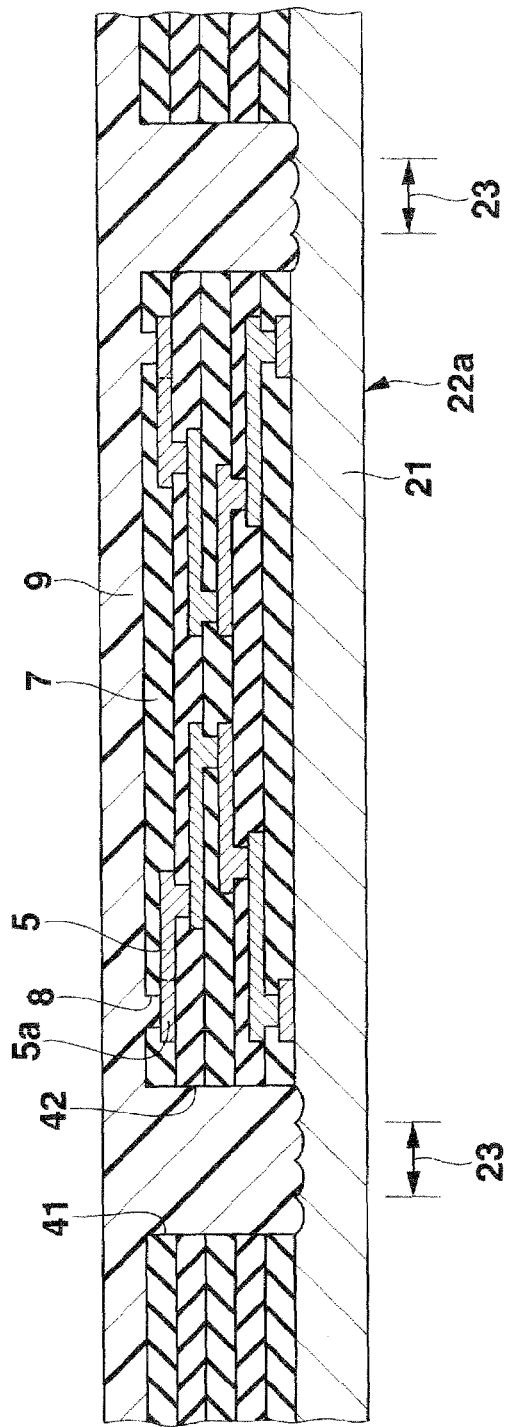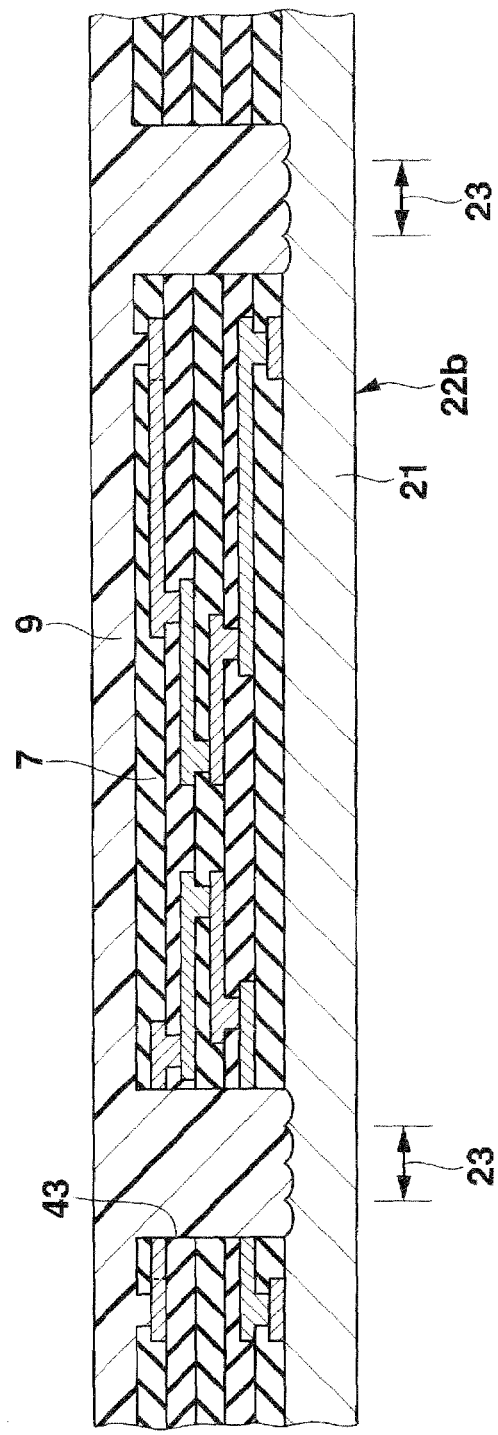

METHOD OF MANUFACTURING SEMICONDUCTOR DEVICE HAVING SEMICONDUCTOR FORMATION REGIONS OF DIFFERENT PLANAR SIZES

CROSS-REFERENCE TO RELATED APPLICATIONS

This application is based upon and claims the benefit of priority from prior Japanese Patent Application No. 2007-320303, filed Dec. 12, 2007, the entire contents of which are incorporated herein by reference.

BACKGROUND OF THE INVENTION

1. Field of the Invention

This invention relates to a method of manufacturing a semiconductor device having semiconductor formation regions of different planar sizes.

2. Description of the Related Art

As a semiconductor device installed in small-sized electronic equipment typified by, for example, portable electronic equipment, a chip size package (CSP) having about the same size (planar size and dimensions) as a semiconductor substrate has been known. Among the CSPs, there is one called a wafer level package (WLP) which is packaged in a wafer state and separated into semiconductor devices by dicing.

In such a conventional semiconductor device, as disclosed in, for example, Jpn. Pat. Appln. KOKAI Publication No. 2004-349461, a wiring line is provided on the upper surface of an insulating film provided on a semiconductor substrate, a columnar electrode is provided on the upper surface of a connection pad portion of the wiring line, a sealing film is provided on the upper surface of the insulating film including the wiring line so that the upper surface of this sealing film is flush with the upper surface of the columnar electrode, and a solder ball is provided on the upper surface of the columnar electrode.

In the meantime, there is one such semiconductor device in which an interlayer insulating film/wiring line stack structure component comprising a stack structure composed of an interlayer insulating film and a wiring line is provided between a semiconductor substrate and an insulating film. In this case, if the distance between the wiring lines in the interlayer insulating film/wiring line stack structure component decreases in accordance with miniaturization, the capacity between the wiring lines increases, resulting in an increased delay of a signal transmitted through the wiring lines.

In order to improve this, a low dielectric constant material, called a low-k material, has been attracting attention as the material of the interlayer insulating film, in which the dielectric constant is lower than the dielectric constant of 4.2, to 4.0, of silicon oxide, which generally used as the material of the interlayer insulating film. The low-k material includes, for example, SiOC in which silicon oxide ($SiO_2$) is doped with carbon (C), or SiOCH containing H. In order to further reduce the dielectric constant, an air-containing porous film with a low dielectric constant is also considered.

Presently, in a method of manufacturing a semiconductor device having a low dielectric constant film/wiring line stack structure component comprising a stack structure composed of a low dielectric constant film as an interlayer insulating film and a wiring line, the low dielectric constant film and the wiring line are stacked and formed on a semiconductor substrate in a wafer state, and an insulating film, an upper wiring line, a columnar electrode, a sealing film and a solder ball are formed thereon, which are then separated into semiconductor devices by dicing.

However, if the low dielectric constant film is cut with a dicing blade, a large amount of cutoff portions and damage are caused in the cut surface of the low dielectric constant film due to the fragility of the low dielectric constant film. Thus, one method under consideration is to remove a part, which corresponds to a dicing street, of the low dielectric constant film formed on the semiconductor substrate in a wafer state at a relatively early stage by the application of a laser beam together with a passivation film which is formed on this part and which is made of an inorganic material such as silicon nitride.

However, in the semiconductor device manufacturing method which removes a part, which corresponds to the dicing street, of the low dielectric constant film formed on the semiconductor substrate in a wafer state at a relatively early stage by the application of a laser beam together with a passivation film which is formed on this part, missing portions may be generated from the surface removed by the application of the laser beam due to low strength of close contact between the low dielectric constant film in this removed surface and the passivation film. Such missing portions could cause problems in the subsequent steps.

BRIEF SUMMARY OF THE INVENTION

It is therefore an object of this invention to provide a semiconductor device manufacturing method in which missing portions are not easily generated from the surface of, for example, a low dielectric constant film removed by the application of a laser beam.

This semiconductor device manufacturing method comprises the steps of:

preparing, on one surface of a semiconductor wafer, a wafer process material which has a plurality of semiconductor formation regions comprising at least a first semiconductor formation region having a first planer size, and a second semiconductor formation region having a second planer size which is different from the first planer size, and which includes a low dielectric constant film/wiring line stack structure component in which a low dielectric constant film and a wiring line are stacked in each semiconductor formation region;

selecting the first semiconductor formation region as a necessary semiconductor formation region from among the semiconductor formation regions, selecting, as an unnecessary semiconductor formation region, the second semiconductor formation region h from among the semiconductor formation regions, in which a dicing street for the necessary semiconductor formation region traverses the second semiconductor formation region, and applying a laser beam to the predetermined width area including the dicing street for the necessary semiconductor formation region and onto a straight extension of the predetermined width area in the wafer process material in order to form a first groove around the dielectric constant film/wiring line stack structure component of the necessary semiconductor formation region and a second groove in an area corresponding to the straight extension within the unnecessary semiconductor formation region;

forming a protective film in at least the second groove formed in the unnecessary semiconductor formation region and on the low dielectric constant film/wiring line stack structure component;

forming, on the protective film in the necessary semiconductor formation region, an upper wiring line connected to the wiring line of the low dielectric constant film/wiring line stack structure component;

forming a sealing film on the low dielectric constant film/wiring line stack structure component and on the upper wiring line within the necessary semiconductor formation region; and cutting at least one of the protective film and the sealing film, and the semiconductor wafer along the dicing street. According to this invention, at least part of the surface of a low dielectric constant film removed by the application of a laser beam is covered with a protective film, such that missing portions cannot be easily generated from the removed surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4A is a sectional view showing a manufacturing step of the a semiconductor device according to the first embodiment of the present invention;

FIG. 4B is a sectional view showing a manufacturing step of the a semiconductor device according to the first embodiment of the present invention;

FIG. 6A is a sectional view showing a manufacturing step of the a semiconductor device according to the first embodiment of the present invention;

FIG. 6B is a sectional view showing a manufacturing step of the a semiconductor device according to the first embodiment of the present invention;

FIG. 10A is a sectional view showing a manufacturing step of the a semiconductor device according to the first embodiment of the present invention;

FIG. 10B is a sectional view showing a manufacturing step of the a semiconductor device according to the first embodiment of the present invention;

FIG. 12A is a sectional view showing a manufacturing step of the a semiconductor device according to the first embodiment of the present invention;

FIG. 12B is a sectional view showing a manufacturing step of the a semiconductor device according to the first embodiment of the present invention;

FIG. 13A is a sectional view showing a manufacturing step of the a semiconductor device according to the first embodiment of the present invention;

FIG. 13B is a sectional view showing a manufacturing step of the a semiconductor device according to the first embodiment of the present invention;

FIG. 14A is a sectional view showing a manufacturing step of the a semiconductor device according to the first embodiment of the present invention;

FIG. 14B is a sectional view showing a manufacturing step of the a semiconductor device according to the first embodiment of the present invention;

FIG. 19A is a sectional view showing a manufacturing step of the a semiconductor device according to the second embodiment of the present invention;

FIG. 19B is a sectional view showing a manufacturing step of the a semiconductor device according to the second embodiment of the present invention;

DETAILED DESCRIPTION OF THE INVENTION

First Embodiment

Figure 1:
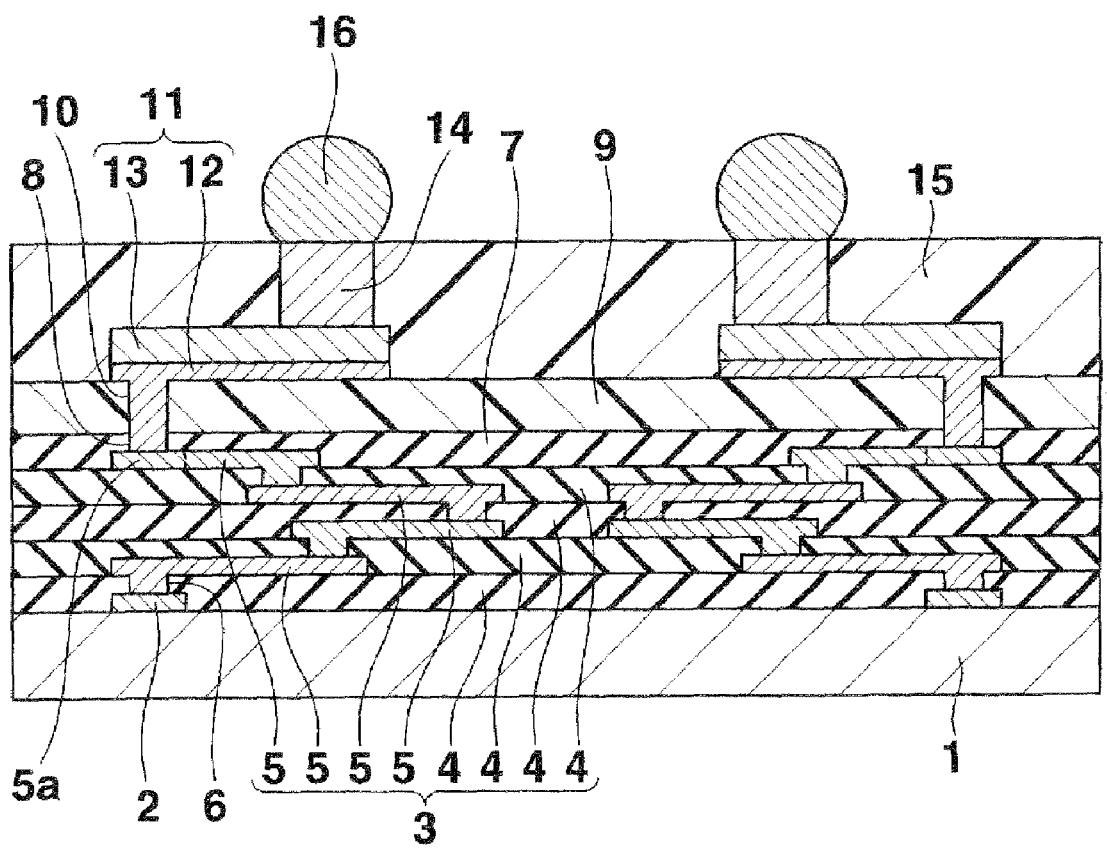
FIG. 1 is a sectional view of one example of a semiconductor device manufactured by a manufacturing method as a first embodiment of this invention.

FIG. 1 shows a sectional view of one example of a semiconductor device manufactured by a manufacturing method as a first embodiment of this invention. This semiconductor device comprises a silicon substrate (semiconductor substrate) 1. An integrated circuit (riot shown) with a predetermined function is provided on the upper surface of the silicon substrate 1. Although two connection pads 2 are shown, a large number of connection pads 2 made of, for example, an aluminum-based metal are actually provided in the peripheral part of the upper surface so that these connection pads are connected to the integrated circuit.

A low dielectric constant film/wiring line stack structure component 3 is provided on the upper surface of the silicon substrate 1. The low dielectric constant film/wiring line stack structure component 3 has a structure in which a plurality of, for example, four low dielectric constant films 4 and the same number of wiring lines 5 made of, for example, an aluminum-based metal are alternately stacked. In this case, the wiring lines 5 of the respective layers are connected to each other between the layers. One end of the lowermost wiring line 5 is connected to the connection pad 2 via an opening 6 provided in the lowermost low dielectric constant film 4. A connection pad portion 5a, of the uppermost wiring line 5 is disposed in the peripheral part of the upper surface of the uppermost low dielectric constant film 4.

The material of the low dielectric constant film 4 includes, for example, a polysiloxane-based material having an Si—O bond and an Si—H bond (HSQ: hydrogen silsesquioxane, a relative dielectric constant of 3.0), a polysiloxane-based material having an Si—O bond and an Si—CH$_3$, bond (MSQ: methyl silsesquioxane, a relative dielectric constant of 2.7, to 2.9), carbon added silicon oxide (SiOC: carbon doped silicon oxide, a relative dielectric constant of 2.7, to 2.9), or a low-k material based on an organic polymer. A material having a relative dielectric constant of 3.0, or less and a glass transition temperature of 400° C. or more can be used as the material of the low dielectric constant film 4.

The organic polymer based low-k material includes, for example, "SiLK (a relative dielectric constant of 2.6)" manufactured by Dow Chemical Corporation, or "FLARE (a relative dielectric constant of 2.8)" manufactured by Honeywell Electronic Materials Corporation. Here, having a glass transition temperature of 400° C. or more is intended to provide resistance to the temperature in a manufacturing step described later. It is to be noted that porous types of the above-mentioned materials can also be used.

Furthermore, in addition to the materials mentioned above, it is also possible to use, as the material of the low dielectric constant film 4, a material which has a relative dielectric constant higher than 3.0, in a normal state but can be made porous so that it may have a relative dielectric constant of 3.0, or less and a glass transition temperature of 400° C. or more. Such a material includes, for example, fluoridated silicon oxide (FSG: fluoridated silicate glass, a relative dielectric constant of 3.5, to 3.7), boron added silicon oxide (BSG: boron doped silicate glass, a relative dielectric constant of 3.5), or silicon oxide (a relative dielectric constant of 4.0, to 4.2).

A passivation film 7 made of an inorganic material such as silicon nitride is provided on the upper surface of the uppermost low dielectric constant film 4 including the uppermost wiring line 5. An opening 8 is provided in a part of the passivation film 7 corresponding to the connection pad portion 5a, of the uppermost wiring line 5. A protective film 9 made of an organic material such as a polyimide-based resin is provided on the upper surface of the passivation film 7. An opening 10 is provided in a part of the protective film 9 corresponding to the opening 8 of the passivation film 7. In this context, the passivation film 7 does not necessarily have to be formed of an inorganic material, and may be formed of a material similar to that of the low dielectric constant film 4.

An upper wiring line 11 is provided on the upper surface of the protective film 9. The upper wiring line 11 has a two-layer structure composed of a foundation metal layer 12 made of, for example, copper and provided on the upper surface of the protective film 9, and an upper metal layer 13 made of copper and provided on the upper surface of the foundation metal layer 12. One end of the upper wiring line 11 is connected to the connection pad portion 5a, of the uppermost wiring line 5 via the openings 8, 10 of the passivation film 7 and the protective film 9.

A columnar electrode 14 made of copper is provided on the upper surface of a connection pad portion of the upper wiring line 11. A sealing film 15 made of an organic material such as epoxy-based resin is provided on the upper surface of the protective film 9 including the upper wiring line 11 so that the upper surface of this sealing film 15 is flush with the upper surface of the columnar electrode 14. A solder ball 16 is provided on the upper surface of the columnar electrode 14.

Figure 2:
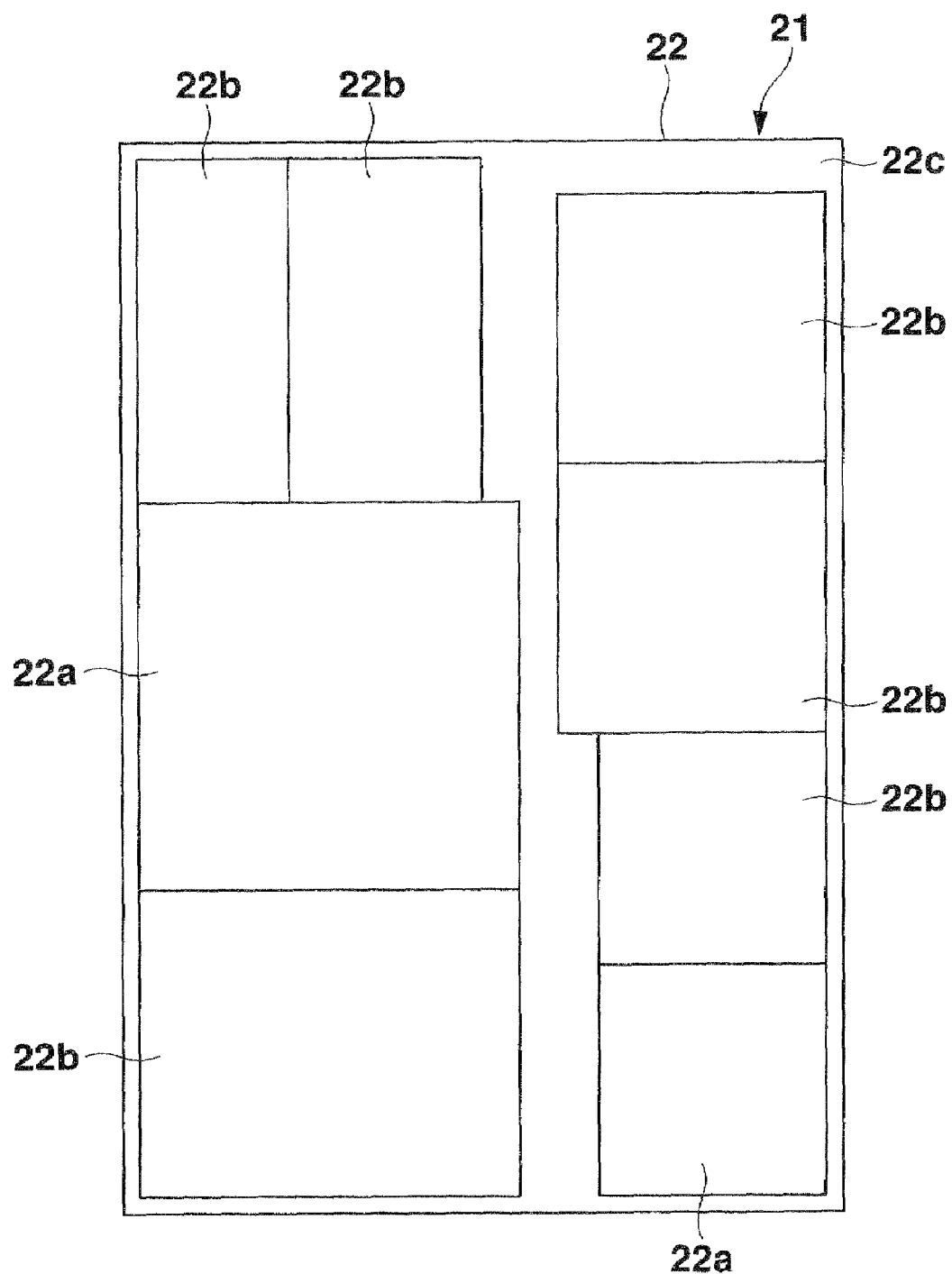
FIG. 2 is a plan view shown to explain the planar state of part of a trial semiconductor wafer.

Next, one example of a method of manufacturing this semiconductor device is described. In this case, as shown in FIG. 2, in a rectangular region 22 of a part of a silicon substrate in a wafer state (hereinafter referred to as a semiconductor wafer 21), there are a plurality of semiconductor device formation regions 22a, 22b, having a planar shape (square or rectangular shape) and having different planar sizes), and an extra region 22c.

Furthermore, various integrated circuits (not shown) are formed in the respective semiconductor device formation regions (device regions) 22a, 22b, on the upper surface of the semiconductor wafer 21. In addition, integrated circuits of many kinds are formed in one semiconductor wafer 21 in order to manufacture small-production or trial semiconductor devices, and necessary integrated circuits alone are formed into semiconductor devices and taken out. Here, two semiconductor device formation regions, indicated by 22a, are regions in which the integrated circuits needed this time and to be taken out of the semiconductor wafer 21 are formed, and other semiconductor device formation regions, indicated by 22b, are regions in which the integrated circuits not needed to be taken out as integrated circuit devices are formed. In this context, the semiconductor device formation regions 22a are hereinafter referred to as necessary semiconductor formation regions, and the semiconductor device formation regions 22b, are hereinafter referred to as unnecessary semiconductor formation regions. It should, however, be understood that any of the semiconductor device formation regions 22b, can be a necessary region and other semiconductor device formation regions 22b, and the semiconductor device formation regions 22a, can be unnecessary regions.

Under such a condition, finally, only the two necessary semiconductor device formation regions 22a are separated, and other unnecessary semiconductor device formation regions, indicated by 22b, and the extra region 22c, are ignored. As a result, as indicated by chain double-dashed lines in FIG. 3, straight dicing streets 23 are set as straight lines along four sides of each of the two necessary semiconductor device formation regions 22a. Parts of the dicing streets 23 traverse the unnecessary semiconductor device formation regions 22b, and the extra region 22c, which, however, causes no trouble in taking out the necessary semiconductor device Formation regions 22a.

Now, in manufacturing the semiconductor device shown in FIG. 1 from the necessary semiconductor device formation region 22a, of the semiconductor wafer 21, a wafer process material shown in FIGS. 4A, 4B is first prepared. In this case, FIG. 4A is a sectional view of the necessary semiconductor device formation region 22a in a part along $IV_A$-$IV_A$, in FIG. 3, and FIG. 4B is a sectional view of the unnecessary semiconductor device formation region 22b, in a part along $IV_B$-$IV_B$, in FIG. 3.

In this prepared material, in each of the necessary semiconductor device formation region 22a, and the unnecessary semiconductor device formation region 22b, the connection pad 2, four low dielectric constant films 4 and four wiring lines 5, and the passivation film 7 are formed on the semiconductor wafer 21, and the center of the connection pad portion 5a, of the uppermost wiring line 5 is exposed via the opening 8 formed in the passivation film 7.

As the material of the low dielectric constant film 4, the materials mentioned above can be taken as examples, and a material having a relative dielectric constant of 3.0, and a glass transition temperature of 400° C. or more can be used, including porous types of such material. In addition, zones indicated by 23 are zones corresponding to the dicing streets in FIGS. 4A, 4B.

Figure 3:
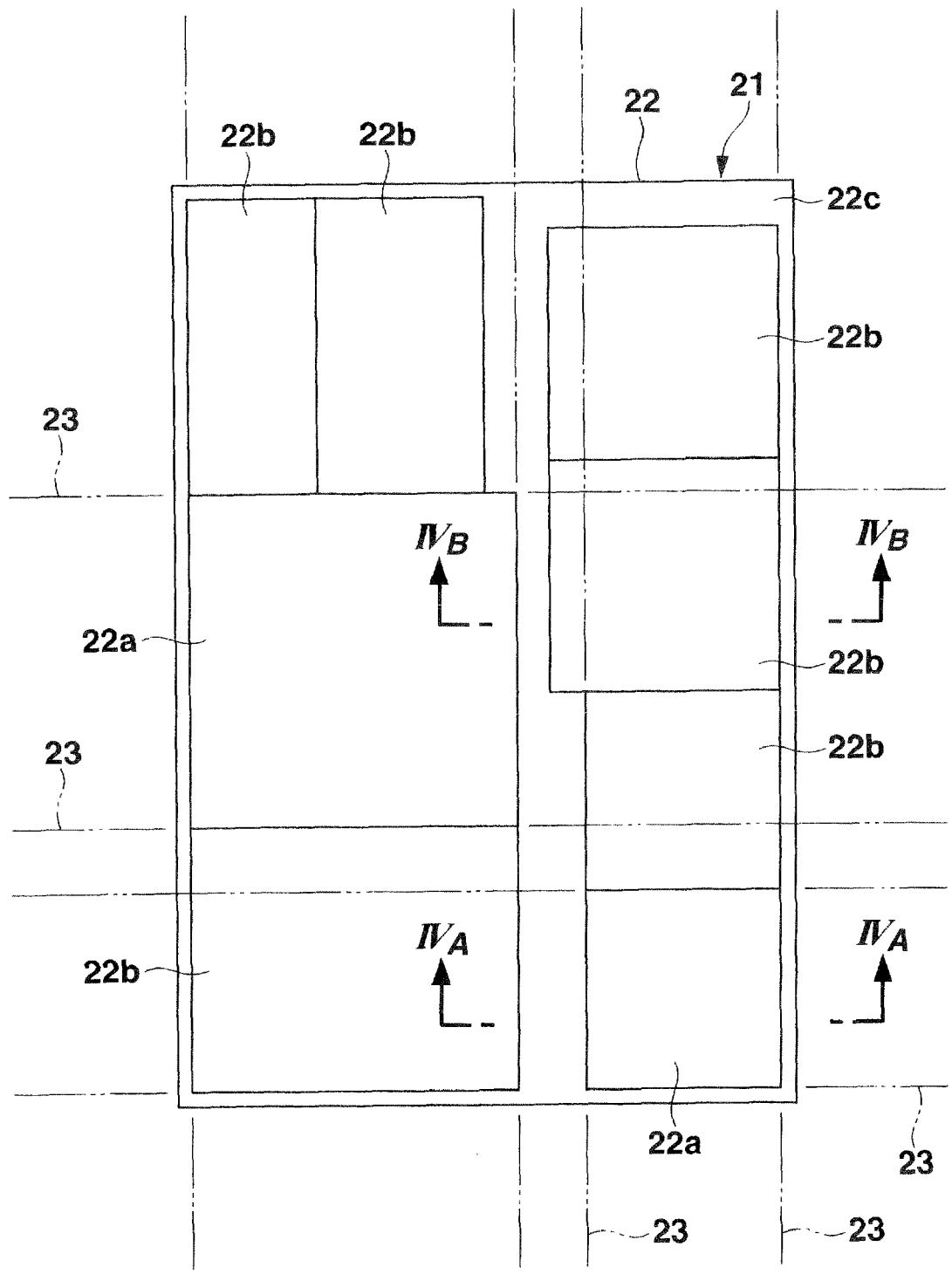
FIG. 3 is a plan view shown to explain dicing streets in the semiconductor wafer shown in FIG. 2.

Here, in the necessary semiconductor device formation region 22a, in the part along $IV_A$-$IV_A$, in FIG. 3, zones along its four sides are zones corresponding to the dicing streets 23. In the unnecessary semiconductor device formation region 22b in the part along $IV_B$-$IV_B$, in FIG. 3, a zone along its right side alone is a zone corresponding to the dicing street 23, but zones on its left side and upper side are zones where the dicing streets 23 traverse the unnecessary semiconductor device formation region 22b.

Therefore, in the part of the necessary semiconductor device formation region 22a, shown in FIG. 4A, the connection pads 2 and the wiring lines 5 are located inside the dicing streets 23. On the other hand, in the unnecessary semiconductor device formation region 22b, shown in FIG. 4B, the right connection pad 2 is disposed in a device region inside (on the left side of) the dicing streets 23, but the left connection pad 2 is disposed outside (on the left side of) the dicing street 23, and a part of the wiring line 5 overlaps the dicing street 23.

Figure 5A:
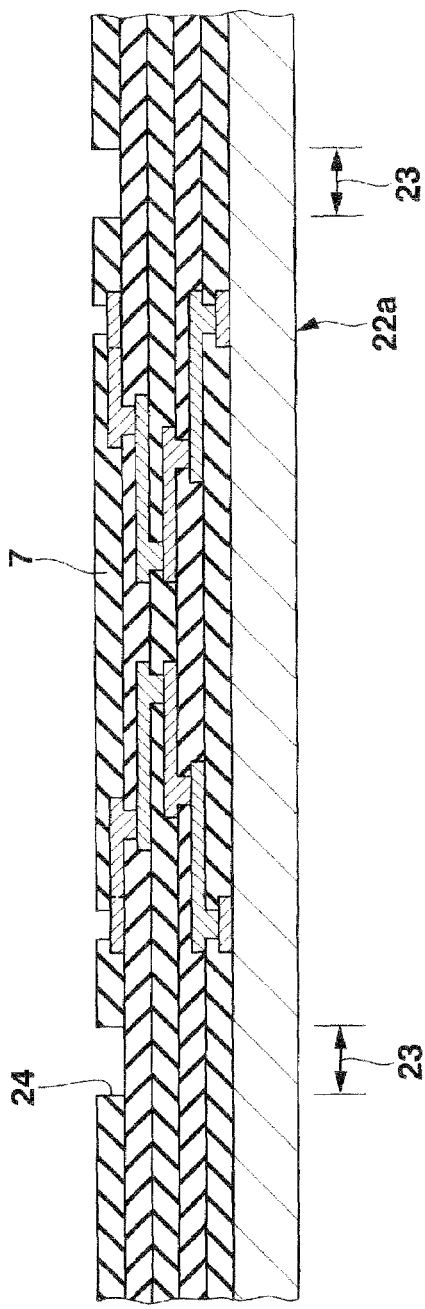
FIG. 5A is a sectional view showing a manufacturing step of the a semiconductor device according to the first embodiment of the present invention.
Figure 5B:
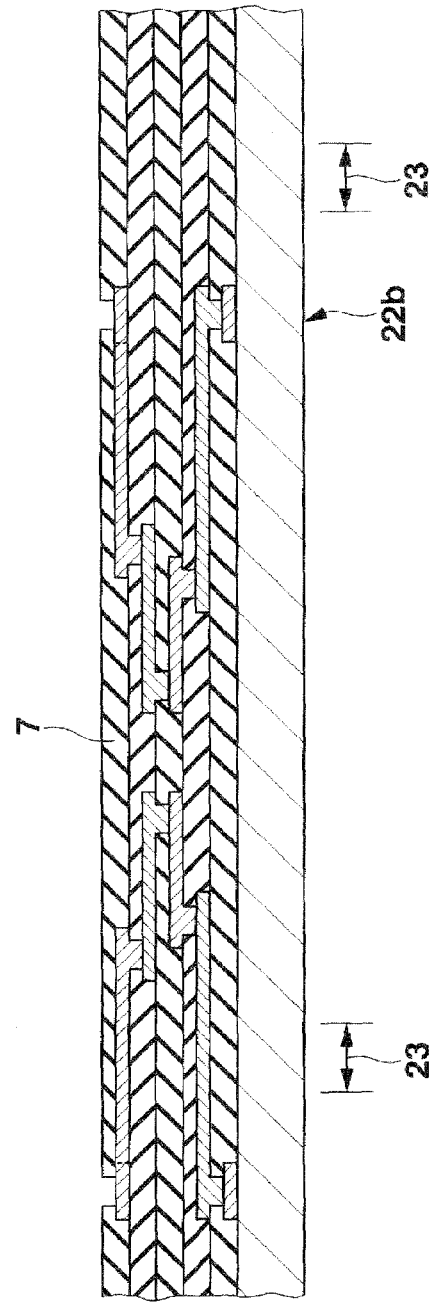
FIG. 5B is a sectional view showing a manufacturing step of the a semiconductor device according to the first embodiment of the present invention.

Presently, when the materials shown in FIGS. 4A, 4B are prepared, a first groove (laser groove formation preliminary groove) 24 is then formed by a photolithographic method in the passivation film 7 in the zones corresponding to the dicing streets 23 along four sides of the necessary semiconductor device formation region 22a, as shown in FIG. 5A. In this case, as shown in FIG. 5B, no such groove is formed in the passivation film 7 in the unnecessary semiconductor device formation region 22b.

Then, as shown in FIG. 6A, in the necessary semiconductor device formation region 22a, a second groove 25 is formed in the four low dielectric constant films 4 in a zone corresponding to the first groove 24 (i.e., the dicing street 23) of the passivation film 7 by laser processing in which a laser beam is applied. In this state, the upper surface of the semiconductor wafer 21 on the dicing streets 23 is exposed via the first and second grooves 24, 25. Further, the four low dielectric constant films 4 and the passivation film 7 stacked on the semiconductor wafer 21 are separated by the first and second grooves 24, 25, such that the low dielectric constant film/wiring line stack structure component 3 shown in FIG. 1 is formed.

Furthermore, as shown in FIG. 6B, in the unnecessary semiconductor device formation region 22b, a groove 26 is formed in the passivation film 7 and the four low dielectric constant films 4 on the dicing street 23 by laser processing in which a laser beam is applied. In this case, a part of the wiring line 5 overlaps the dicing street 23 in the unnecessary semiconductor device formation region 22b, so that the wiring line 5 in the overlapping part is removed. Moreover, the upper surface of the semiconductor wafer 21 on the dicing streets 23 is exposed via the groove 26.

Here, in the case of processing the second groove 25 and the groove 26 by the laser beam application, the upper surface of the semiconductor wafer 21 melts when the laser beam is applied onto the upper surface of the semiconductor wafer 21, and the melted parts splash from the semiconductor wafer 21 and then drop onto the semiconductor wafer 21, which results in the bottom surfaces of the second groove 25 and the groove 26 becoming uneven.

In the meantime, in the unnecessary semiconductor device formation region 22b, the passivation film 7, the low dielectric constant films 4 and the wiring lines 5 corresponding to the dicing street 23 are removed by the laser beam application to form the left groove 26, such that the surfaces of the removed parts are exposed. In this case, the strength of close contact between the low dielectric constant films 4 and the passivation film 7 as well as the wiring lines 5 is low, and missing portions may be generated from the surfaces of the removed parts. Moreover, the passivation film 7 and the low dielectric constant films 4 corresponding to the dicing street 23 are removed by the laser beam application to form the right groove 26, so that missing portions may be generated from the surfaces of the removed parts.

On the other hand, in the part of the necessary semiconductor device formation region 22a, the first groove 24 is formed by the photolithographic method in the passivation film 7 in the dicing streets 23 along four sides of this region, and then the four low dielectric constant films 4 alone are removed by the laser beam application to form the second groove 25. Thus, the strength of close contact between the surfaces of the removed parts of the four low dielectric constant films 4 is higher than the strength of close contact between the above-mentioned materials of different materials and missing portions are relatively less easily generated from the surfaces of the removed parts.

Figure 7A:
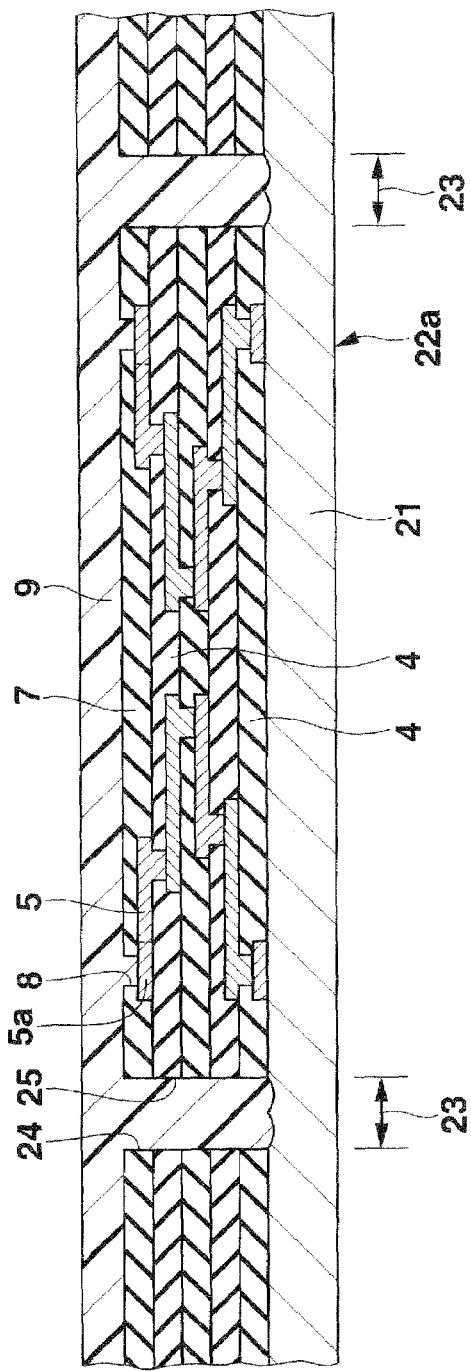
FIG. 7A is a sectional view showing a manufacturing step of the a semiconductor device according to the first embodiment of the present invention.
Figure 7B:
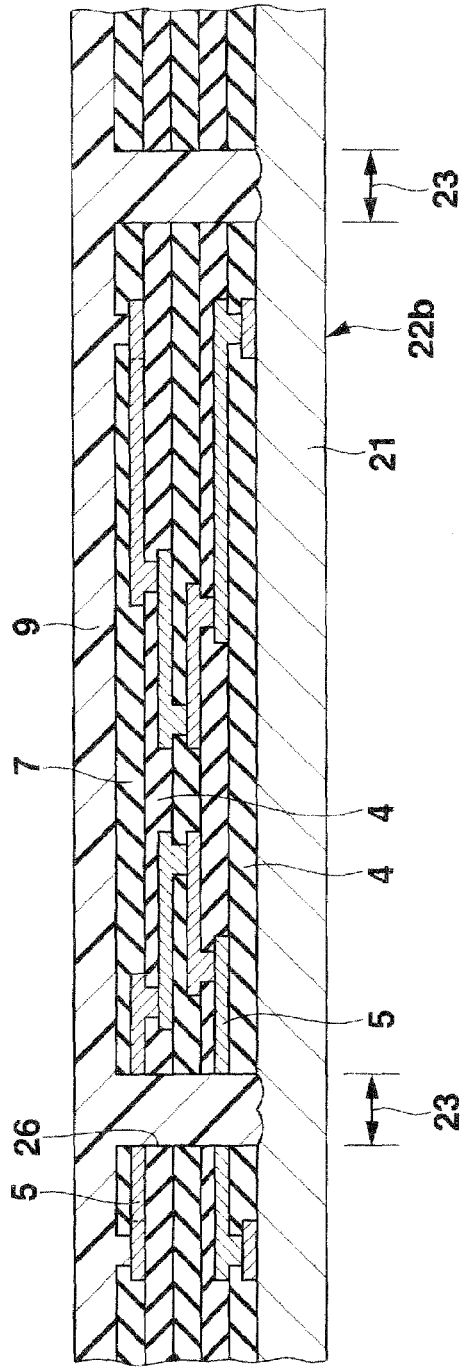
FIG. 7B is a sectional view showing a manufacturing step of the a semiconductor device according to the first embodiment of the present invention.

Then, as shown in FIGS. 7A, 7B, the protective film 9 made of an organic material such as a polyimide-based resin is formed by, for example, a screen printing method or spin coat method on the upper surface of the passivation film 7 including the upper surface of the connection pad portion 5a, of the uppermost wiring line 5 exposed via the opening 8 in the passivation film 7 of the necessary semiconductor device formation region 22a, the upper surface of the semiconductor wafer 21 exposed via the first and second grooves 24, 25 and the upper surface of the semiconductor wafer 21 exposed via the groove 26.

Figure 8A:
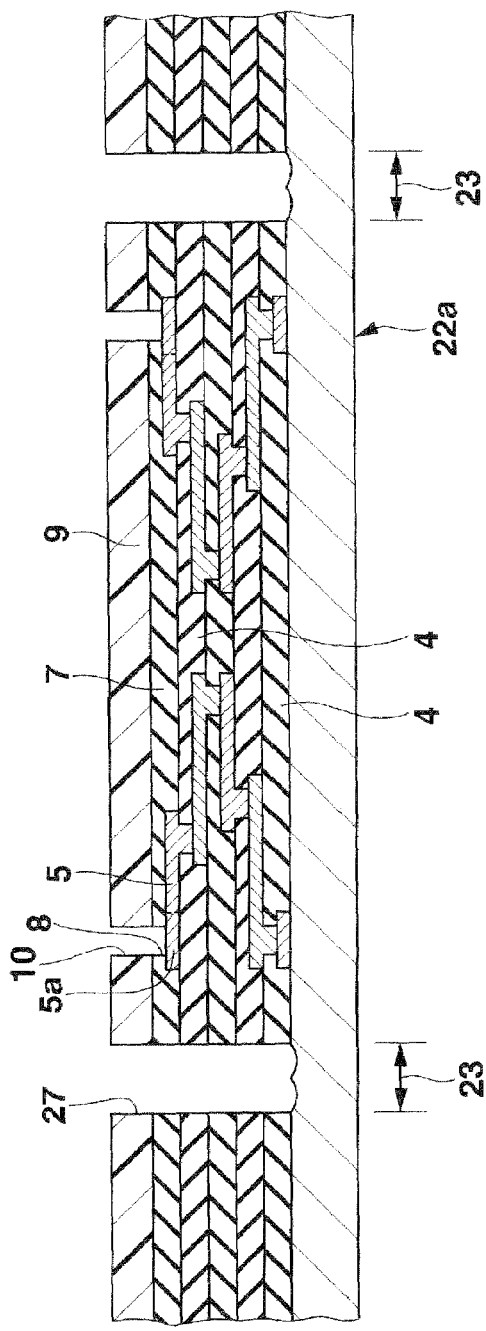
FIG. 8A is a sectional view showing a manufacturing step of the a semiconductor device according to the first embodiment of the present invention.

Then, as shown in FIG. 8A, in the part of the necessary semiconductor device formation region 22a, the openings 8, 10 are formed by the photolithographic method in the protective film 9 and the passivation film 7 in the part corresponding to the connection pad portion 5a, of the uppermost wiring line 5. Moreover, a groove 27 (another groove) is formed in the protective film 9, the passivation film 7 and the four low dielectric constant films 4 only on the dicing streets 23 along four sides of the necessary semiconductor device formation region 22a. No such groove is formed on the dicing streets 23 in other regions, as shown in, for example, FIG. 8B.

Figure 8B:
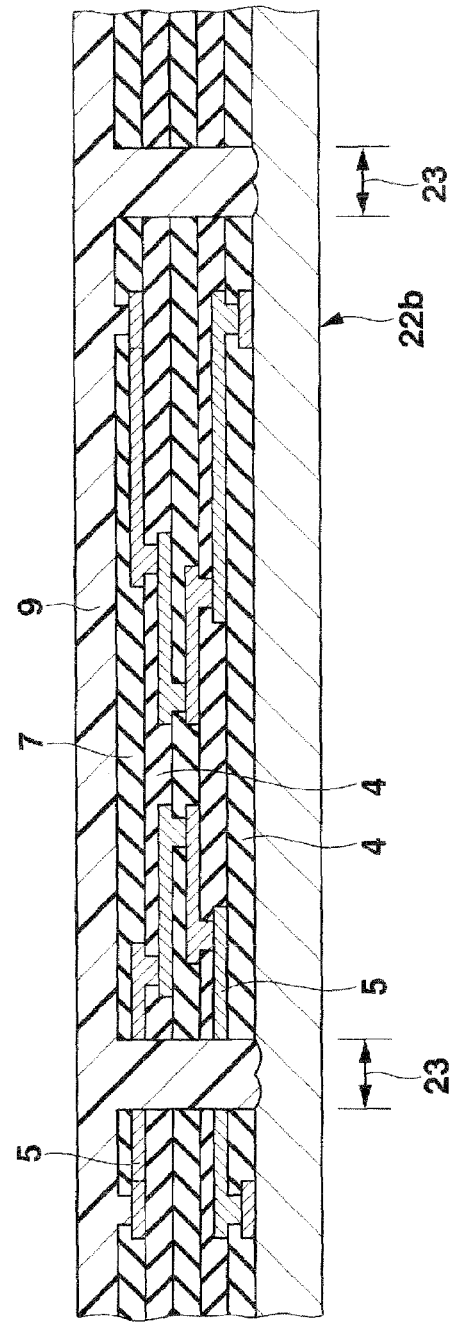
FIG. 8B is a sectional view showing a manufacturing step of the a semiconductor device according to the first embodiment of the present invention.

Therefore, in this state, since the surfaces of the passivation film 7, the low dielectric constant films 4 and the wiring lines 5 removed by the laser beam application are covered with the protective film 9 as shown in, for example, the left of FIG. 8B, it is possible to ensure that missing portions are prevented, at the earliest possible stage, from being generated from the surfaces of the removed parts. Moreover, since the surfaces of the passivation film and the low dielectric constant films 4 removed by the laser beam application are covered with the protective film 9 as shown in, for example, the right of FIG. 8B, it is possible to ensure that missing portions are prevented, at the earliest possible stage, from being generated from the surfaces of the removed parts.

On the other hand, as shown in FIG. 8A, in the necessary semiconductor device formation region 22a, the surfaces of the low dielectric constant films 4 removed by the laser beam application are exposed via the groove 27, but missing portions are relatively less easily generated from the surfaces of the removed parts as described above, so that there is no significant problem as it is. In addition, in the step shown in FIG. 8A, the openings 8, 10 alone may be formed, and the groove 27 may not be formed. In such a case, it is possible to ensure that missing portions are prevented from being generated from the surfaces of the removed parts.

Figure 9A:
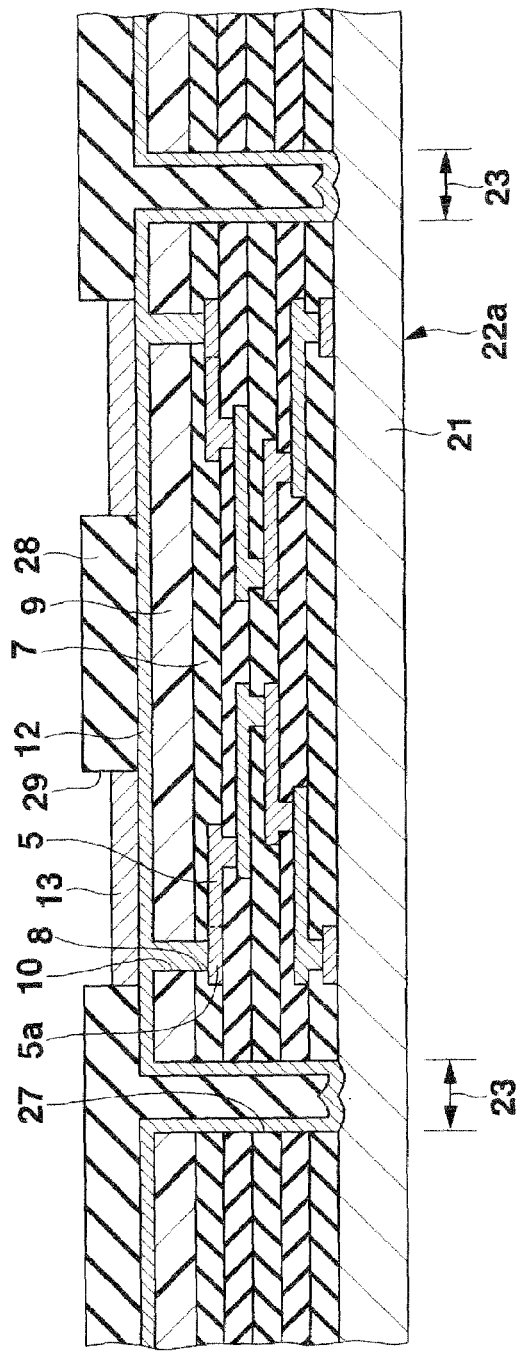
FIG. 9A is a sectional view showing a manufacturing step of the a semiconductor device according to the first embodiment of the present invention.
Figure 9B:
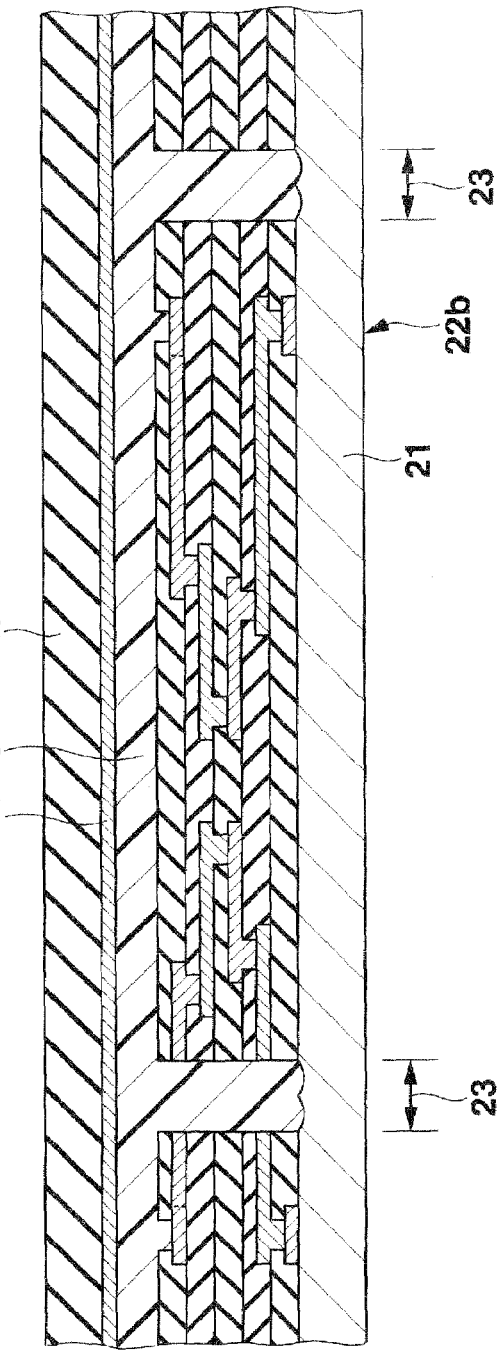
FIG. 9B is a sectional view showing a manufacturing step of the a semiconductor device according to the first embodiment of the present invention.

Then, as shown in FIGS. 9A, 9B, the foundation metal layer 12 is formed on the entire upper surface of the protective film 9 including the upper surface of the connection pad portion 5a, of the uppermost wiring line 5 exposed via the openings 8, 10 in the passivation film 7 and the protective film 9 of the necessary semiconductor device formation region 22a, and the upper surface of the semiconductor wafer 21 exposed via the groove 27. In this case, the foundation metal layer 12 may only be a copper layer formed by electroless plating, may only be a copper layer formed by sputtering, or may be a copper layer formed by sputtering on a thin film layer such as titanium formed by sputtering.

Next, a plating resist film 28 is patterned/formed by the photolithographic method on the upper surface of the foundation metal layer 12. In this case, an opening 29 is formed in a part of the plating resist film 28 corresponding to an area of the necessary semiconductor device formation region 22a, where the upper metal layer 13 is to be formed. Then, electrolytic plating with copper is carried out using the foundation metal layer 12 as a plating current path, thereby forming the upper metal layer 13 on the upper surface of the foundation metal layer 12 in the opening 29 of the plating resist film 28. Subsequently, the plating resist film 28 is released.

Then, as shown in FIGS. 10A, 10B, a plating resist film 30 is patterned/formed on the upper surface of the foundation metal layer 12 including the upper metal layer 13. In this case, an opening 31 is formed in a part of the plating resist film 30 corresponding to a connection pad portion of the upper metal layer 13 (an area where the columnar electrode 14 is to be formed). Then, electrolytic plating with copper is carried out using the foundation metal layer 12 as a plating current path, such that the columnar electrode 14 having a height of 50, to 15 0μm is formed on the upper surface of the connection pad portion of the upper metal layer 13 in the opening 31 of the plating resist film 30.

Figure 11A:
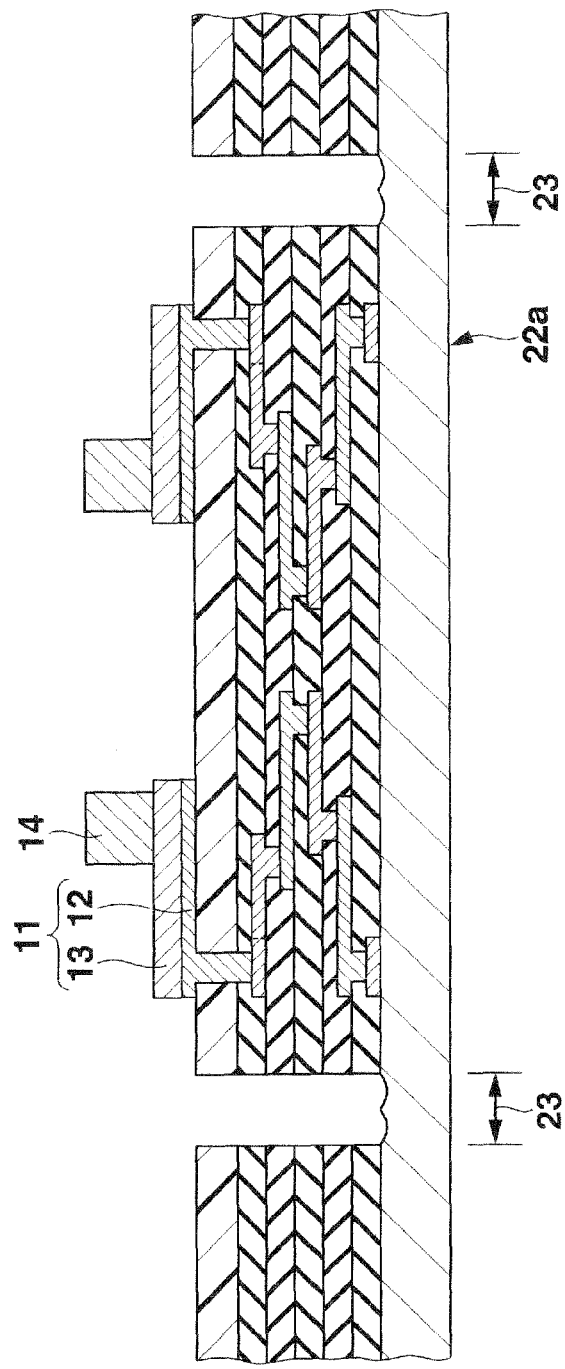
FIG. 11A is a sectional view showing a manufacturing step of the a semiconductor device according to the first embodiment of the present invention.
Figure 11B:
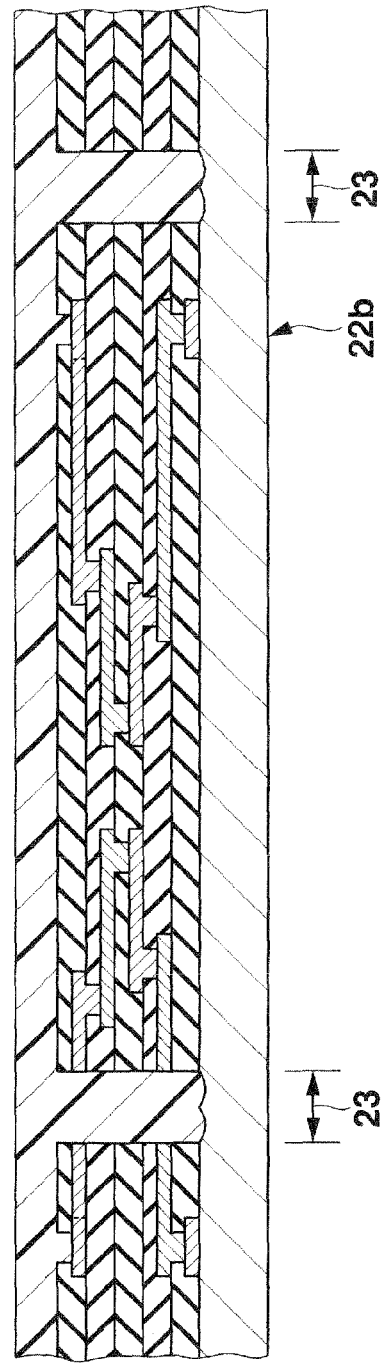
FIG. 11B is a sectional view showing a manufacturing step of the a semiconductor device according to the first embodiment of the present invention.

Then, the plating resist film 30 is released, and the upper metal layer 13 is used as a mask to etch and remove unnecessary parts of the foundation metal layer 12, such that the foundation metal layer 12 remains under the upper metal layer 13 alone, as shown in FIG. 11A. In this state, the upper wiring line 11 having a two-layer structure is formed by the foundation metal layer 12 and the upper metal layer 13. Here, as shown in FIG. 11B, the unnecessary semiconductor device formation region 22b, is an unnecessary region, and no upper wiring line and columnar electrode are therefore formed therein.

Then, as shown in FIGS. 12A, 12B, on the upper surface of the protective film 9 including the upper wiring line 11 and the columnar electrode 14 and on the upper surface of the semiconductor wafer 21 exposed via the groove 27, the sealing film 15 made of an organic material such as epoxy-based resin is formed by, for example, the screen printing method or the spin coat method so that the thickness of this sealing film 15 is greater than the height of the columnar electrode 14. Therefore, in this state, the upper surface of the columnar electrode 14 is covered with the sealing film 15.

Then, the upper surface side of the sealing film 15 is appropriately ground, such that the upper surface of the columnar electrode 14 is exposed, and the upper surface of the sealing film 15, including the exposed upper surface of the columnar electrode 14, is planarized, as shown in FIGS. 13A, 13B. In this planarization of the upper surface of the sealing film 15, the upper surface part of the columnar electrode 14 may be ground several μm to several ten μm together with the sealing film 15.

Figures 15A, 15B:
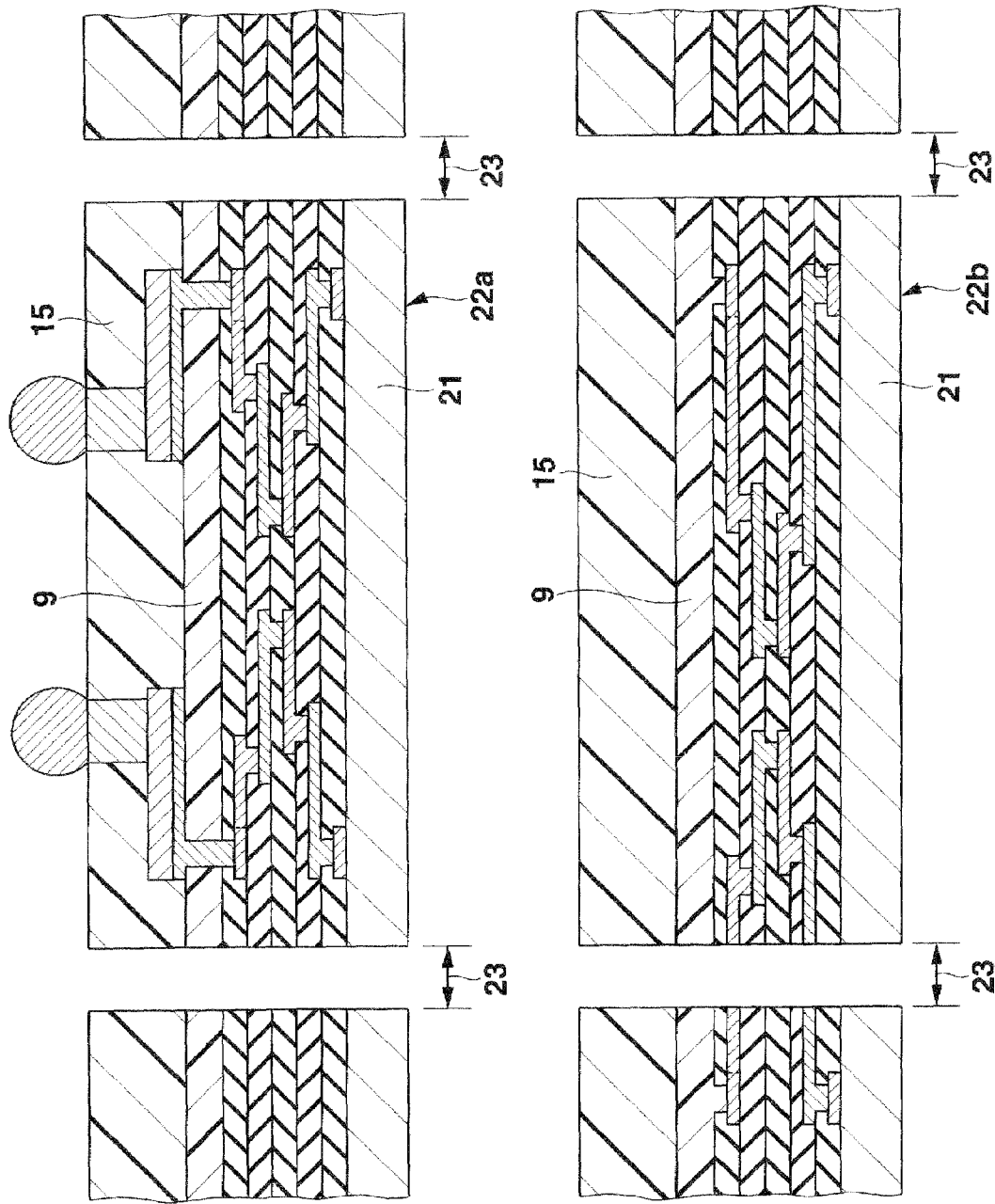
FIG. 15A is a sectional view showing a manufacturing step of the a semiconductor device according to the first embodiment of the present invention.
FIG. 15B is a sectional view showing a manufacturing step of the a semiconductor device according to the first embodiment of the present invention.

Then, as shown in FIGS. 14A, 14B, the solder ball 16 is formed on the upper surface of the columnar electrode 14. Then, as shown in FIGS. 15A, 15B, the sealing film 15, the protective film 9 and the semiconductor wafer 21 are cut along the dicing streets 23. Thus, the semiconductor device shown in FIG. 1 is obtained from the part of the necessary semiconductor device formation region 22a, while an unnecessary semiconductor device is obtained from the part of the unnecessary semiconductor device formation region 22b.

Second Embodiment

Figure 16:
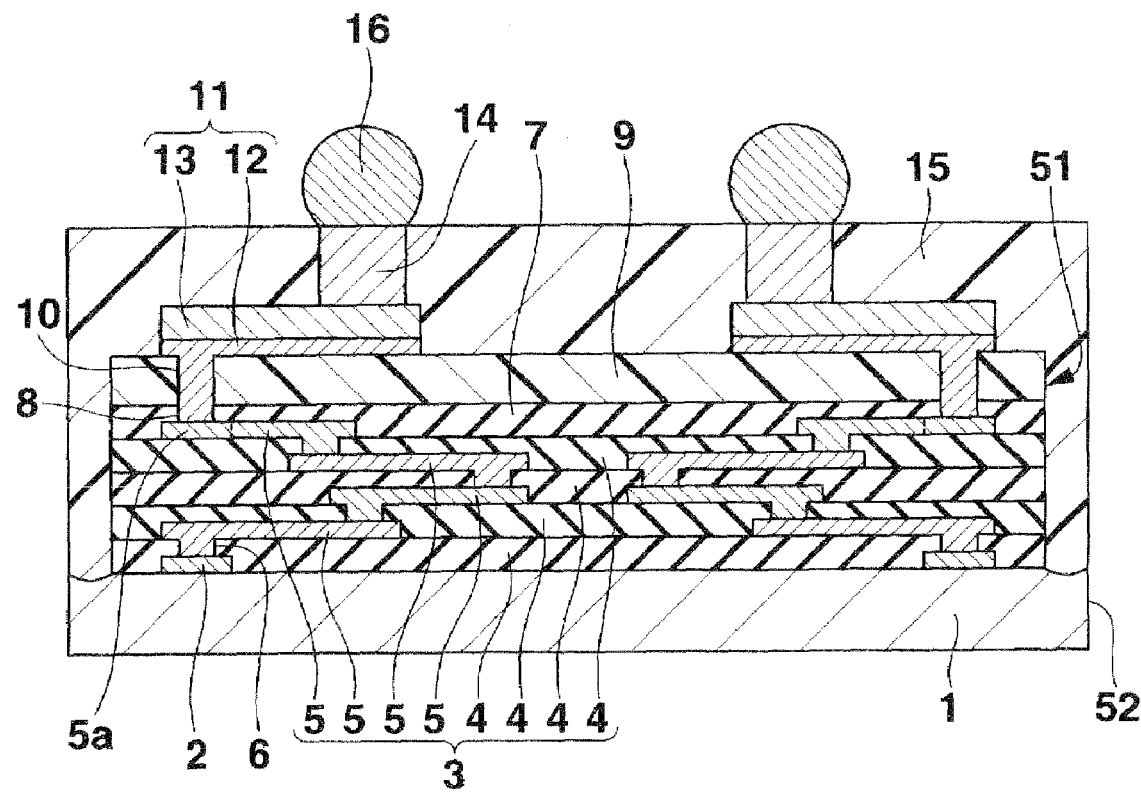
FIG. 16 is a sectional view of one example of a semiconductor device manufactured by a manufacturing method as a second embodiment of this invention.

FIG. 16 shows a sectional view of one example of a semiconductor device manufactured by a manufacturing method as a second embodiment of this invention. This semiconductor device is different from the semiconductor device shown in FIG. 1 in that a peripheral side surface 51 of a low dielectric constant film/wiring line stack structure component 3, a passivation film 7 and a protective film 9 are provided inside a peripheral side surface 52 of a silicon substrate 1 and in that a sealing film 15 is provided on the upper surface of the protective film 9 and on the peripheral upper surface of the silicon substrate 1 outside the low dielectric constant film/wiring line stack structure component 3.

Figure 17A:
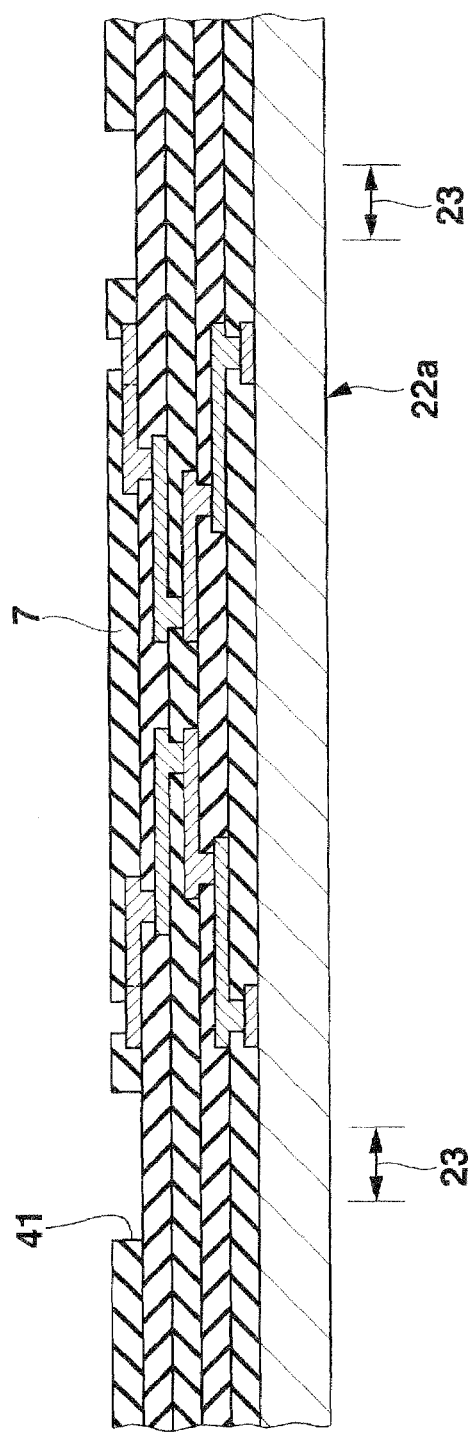
FIG. 17A is a sectional view showing a manufacturing step of the a semiconductor device according to the second embodiment of the present invention.
Figure 17B:
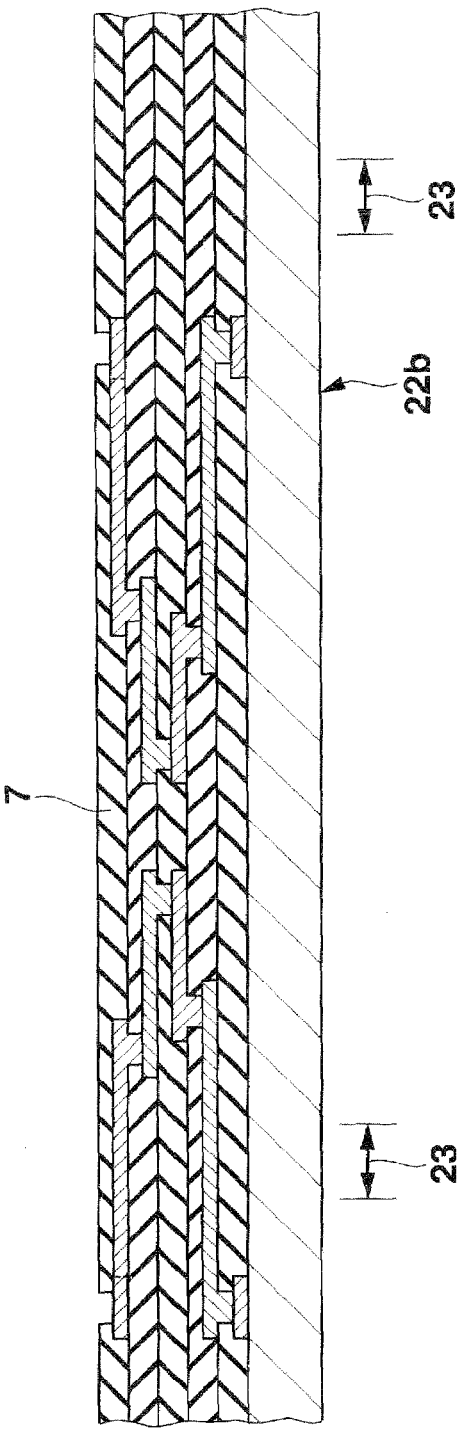
FIG. 17B is a sectional view showing a manufacturing step of the a semiconductor device according to the second embodiment of the present invention.

Next, one example of a method of manufacturing this semiconductor device is described. In this case, after preparing materials shown in FIGS. 4A, 4B, a first groove (laser groove formation preliminary groove) 41 is formed by the photolithographic method in the passivation film 7 on dicing streets 23 along four sides of the necessary semiconductor device formation region 22a, and in regions on their both sides, as shown in FIG. 17A. In this case as well, no such groove is formed in -the passivation film 7 in an unnecessary semiconductor device formation region 22b, as shown in FIG. 17B.

Figure 18A:
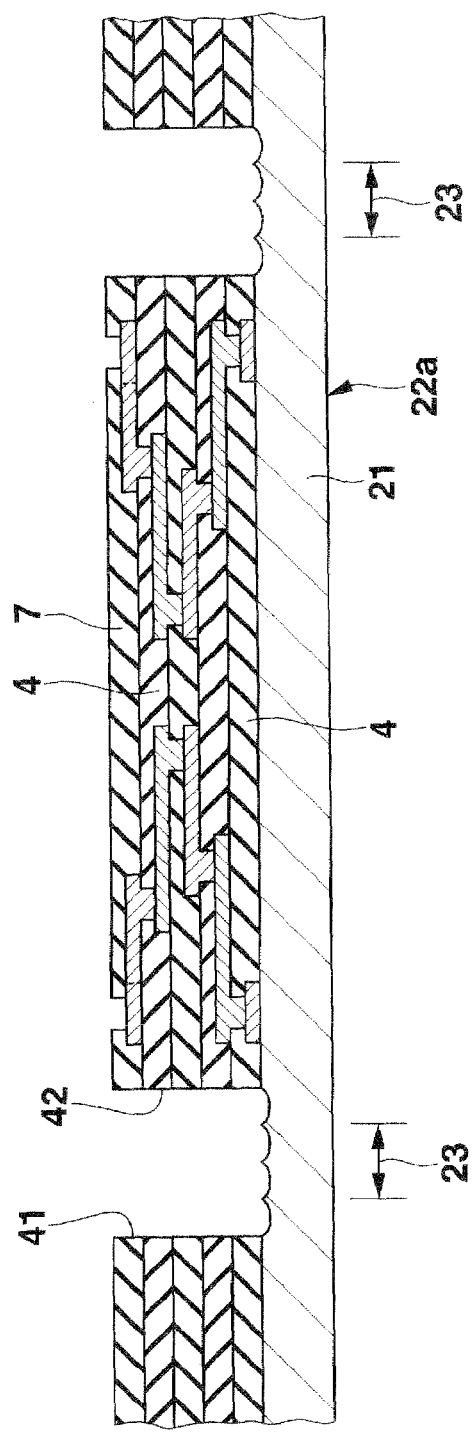
FIG. 18A is a sectional view showing a manufacturing step of the a semiconductor device according to the second embodiment of the present invent ion.

Then, as shown in FIG. 18A, in the part of the necessary semiconductor device formation region 22a, a second groove 42 is formed in four low dielectric constant films 4 in a zone corresponding to the first groove 41 of the passivation film 7 (i.e., on the dicing street 23 and in the areas on its both sides) by laser processing in which a laser beam is applied. In this state, the upper surface of a semiconductor wafer 21 on the dicing streets 23 and in the areas on its both sides is exposed via the first and second grooves 41, 42.

Figure 18B:
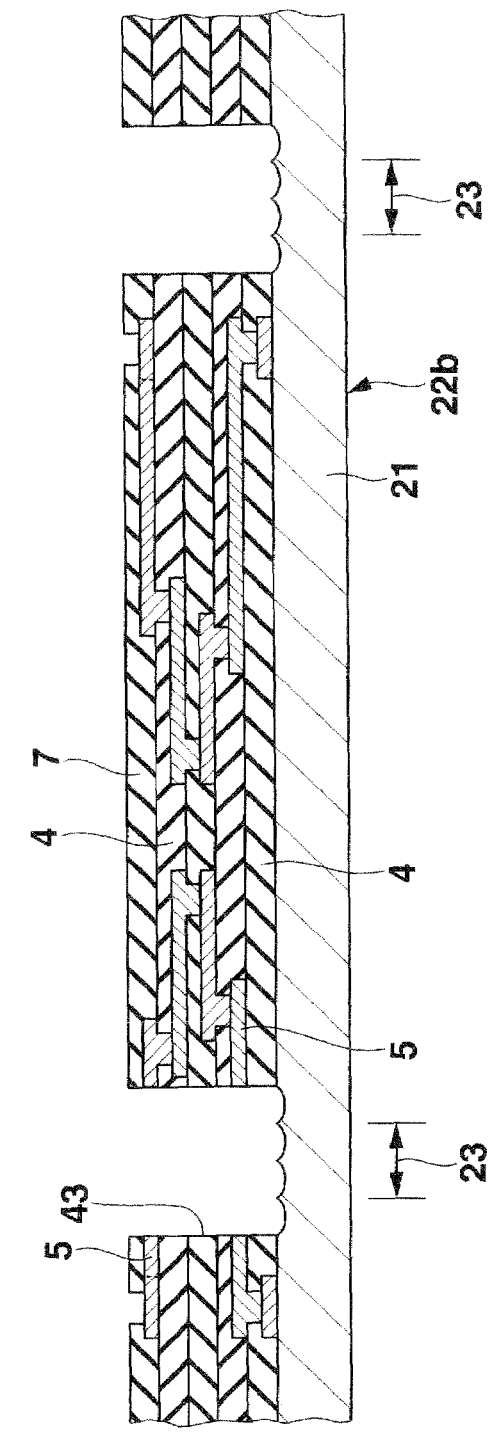
FIG. 18B is a sectional view showing a manufacturing step of the a semiconductor device according to the second embodiment of the present invention.

Then, as shown in FIG. 18B, in the part of the unnecessary semiconductor device formation region 22b, a groove 43 is formed in the passivation film 7 and the four low dielectric constant films 4 on the dicing streets 23 and in the areas on its both sides by the laser processing in which a laser beam is applied. In this case as well, a part of the wiring line 5 overlaps the dicing street 23 in the unnecessary semiconductor device formation region 22b, so that the wiring line 5 in the overlapping part is removed. Moreover, in this state, the upper surface of the semiconductor wafer 21 on the dicing streets 23 and in the areas on its both sides is exposed via the groove 43.

Then, as shown in FIGS. 19A, 19B, the protective film 9, which is made of an organic material such as a polyimide-based resin, is formed by, for example, a screen printing method or spin coat method on the upper surface of the passivation film 7 including the upper surface of a connection pad portion 5a, of the uppermost wiring line 5 exposed via an opening 8 In the passivation film 7 of the necessary semiconductor device formation region 22a, the upper surface of the semiconductor wafer 21 exposed via the first and second grooves 41, 42 and the upper surface of the semiconductor wafer 21 exposed via the groove 43.

Figures 20A, 20B:
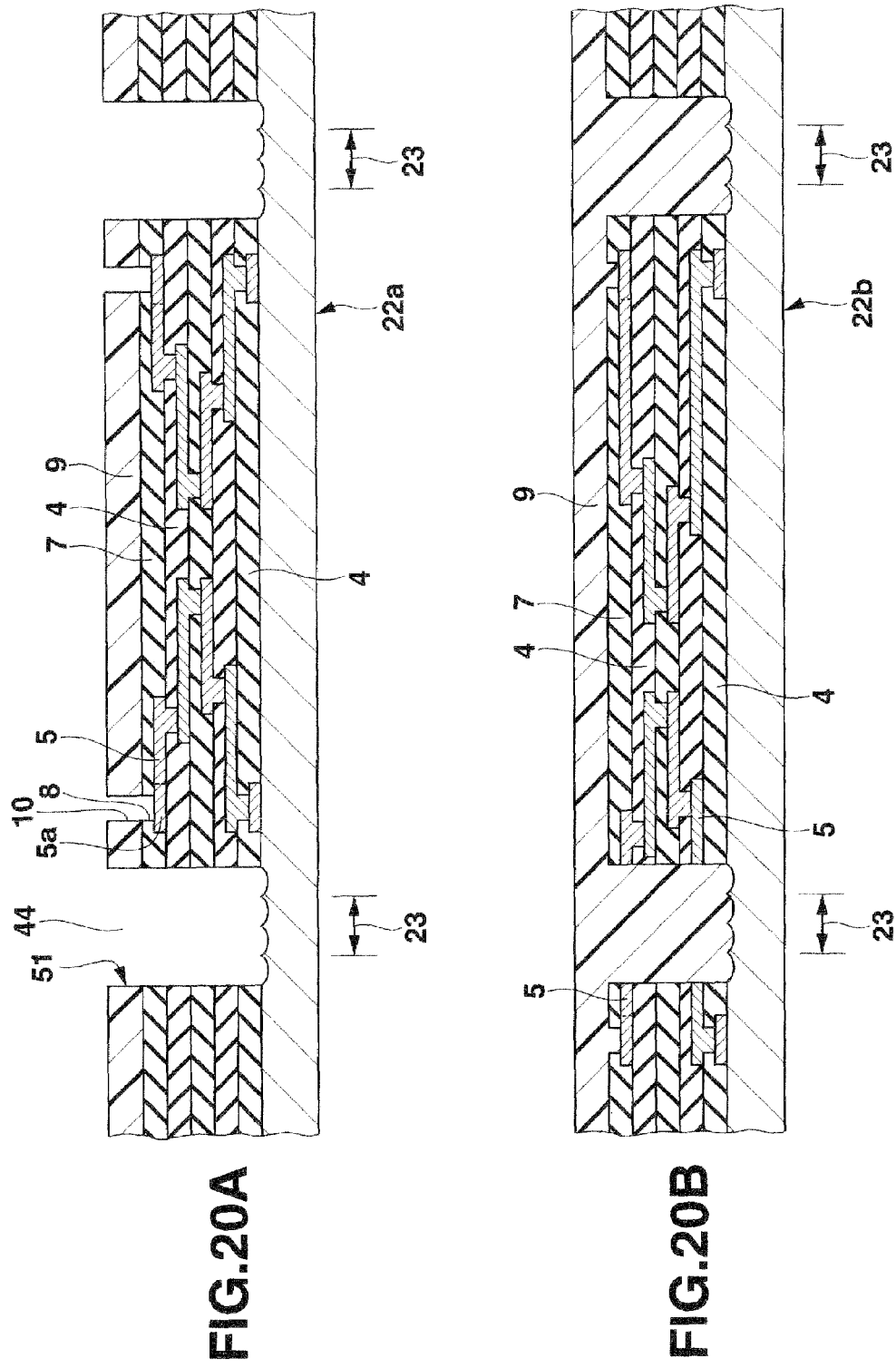
FIG. 20A is a sectional view showing a manufacturing step of the a semiconductor device according to the second embodiment of the present invention.
FIG. 20B is a sectional view showing a manufacturing step of the a semiconductor device according to the second embodiment of the present invention.

Then, as shown in FIG. 20A, in the part of the necessary semiconductor device formation region 22a, the openings 10, 8 are formed by the photolithographic method in the protective film 9 and the passivation film 7 in the part corresponding to the connection pad portion 5a, of the uppermost wiring line 5. Moreover, a groove (another groove) 44 is formed in the protective film 9, the passivation film 7 and the four low dielectric constant films 4 only on the dicing streets 23 along four sides of the necessary semiconductor device formation region 22a, and in the areas on their both sides. The protective film 9, the passivation film 7 and the four low dielectric constant films 4 exposed in the groove 44 constitute the peripheral side surface 51 in FIG. 16. The groove 44 is not formed on the dicing street 23 and in the areas on its both sides in regions other than the necessary semiconductor device formation region 22a, as shown in, for example, FIG. 20B.

After steps similar to those in FIGS. 9A, 9B to FIGS. 14A, 14B described in the first embodiment, the semiconductor device shown in FIG. 16 is obtained from the part of the necessary semiconductor device formation region 22a, and an unnecessary semiconductor device is obtained from the part of the unnecessary semiconductor device formation region 22b. In this case, in the necessary semiconductor device formation region 22a, as shown in FIG. 16, the peripheral side surface 52 of the silicon substrate 1 is flush with the peripheral side surface of the sealing film 15, and the protective film 9, the passivation film 7 and the four low dielectric constant films 4 are located inside the peripheral side surface 52 of the silicon substrate 1. Thus, in the semiconductor device obtained from the part of the necessary semiconductor device formation region 22a, in a completed state, the low dielectric constant film/wiring line stack structure component 3 is provided in the area on the silicon substrate 1 except for its peripheral side part, and the peripheral side surface 51 of the low dielectric constant film/wiring line stack structure component 3, the passivation film 7 and the protective film 9 is covered with the sealing film 15, so that it is possible to provide a structure in which the low dielectric constant film/wiring line stack structure component 3 is not easily released from the silicon substrate 1.

Third Embodiment

Figure 21:
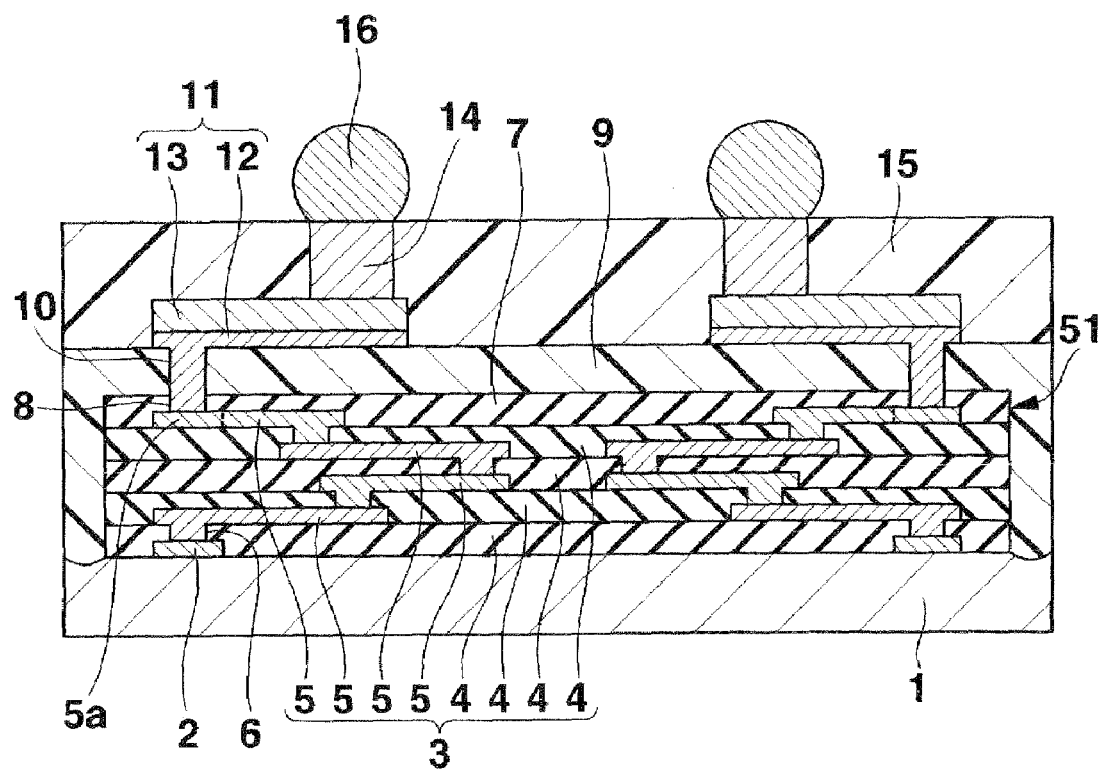
FIG. 21 is a sectional view of one example of a semiconductor device manufactured by a manufacturing method as a third embodiment of this invention.

FIG. 21 shows a sectional view of one example of a semiconductor device manufactured by a manufacturing method as a third embodiment of this invention. This semiconductor device is different from the semiconductor device shown in FIG. 1 in that a low dielectric constant film/wiring line stack structure component 3 is provided in an area on the upper surface of a silicon substrate 1 except for a peripheral side part outside connection pads 2, and in that a protective film 9 with a planar upper surface is provided on the entire upper surface of the peripheral side part of the silicon substrate 1 outside the low dielectric constant film/wiring line stack structure component 3, and in that a sealing film 15 is provided on the protective film 9.

Next, one example of a method of manufacturing this semiconductor device is described. In this case, openings 8, 10 alone are formed and a groove 44 is not formed in the step shown in FIG. 20. In other words, the protective film 9 remains in the groove 44, as shown in FIG. 19A. After steps similar to those in the first embodiment, the semiconductor device shown in FIG. 21 is obtained from the part of the necessary semiconductor device formation region 22a, and an unnecessary semiconductor device is obtained from the part of the unnecessary semiconductor device formation region 22b. In the semiconductor device shown in FIG. 21 obtained from the part of the necessary semiconductor device formation region 22a, in a completed state, the low dielectric constant film/wiring line stack structure component 3 is provided in the area on the silicon substrate 1 except for its peripheral side part, and the side surfaces of the low dielectric constant film/wiring line stack structure component 3 and the passivation film 7 are covered with the protective film 9, so that it is possible to provide a structure in which the low dielectric constant film/wiring line stack structure component 3 is not easily released from the silicon substrate 1.

Other Embodiments

In the structures in the embodiments described above, the upper wiring line 11 is formed on the protective film 9, and the columnar electrode 14 is formed on the connection pad portion of the upper wiring line 11. However, this invention is also applicable to a structure in which an upper wiring line only comprising a connection pad portion is formed on a protective film 9 and an external connection bump electrode such as a solder ball 16 is formed only on the upper wiring line comprising the connection pad portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
preparing, on one surface of a semiconductor wafer, a wafer process material, the wafer process material having a plurality of semiconductor formation regions comprising at least a first semiconductor formation region having a first planer size, and a second semiconductor formation region having a second planer size which is different from the first planer size, and the wafer process material including a low dielectric constant film/wiring line stack structure component in which a low dielectric constant film and a wiring line are stacked in each semiconductor formation region;

selecting the first semiconductor formation region as a necessary semiconductor formation region from among the semiconductor formation regions, selecting, as an unnecessary semiconductor formation region, the second semiconductor formation region from among the semiconductor formation regions, in which a dicing street for the necessary semiconductor formation region traverses the second semiconductor formation region, and applying a laser beam to the predetermined width area including the dicing street for the necessary semiconductor formation region and onto a straight extension of the predetermined width area in the wafer process material in order to form a first groove around the dielectric constant film/wiring line stack structure component of the necessary semiconductor formation region and a second groove in an area corresponding to the straight extension within the unnecessary semiconductor formation region;

forming a protective film in at least the second groove formed in the unnecessary semiconductor formation region and on the low dielectric constant film/wiring line stack structure component;

forming, on the protective film in the necessary semiconductor formation region, an upper wiring line connected to the wiring line of the low dielectric constant film/wiring line stack structure component;

forming a sealing film on the low dielectric constant film/wiring line stack structure component and on the upper wiring line within the necessary semiconductor formation region; and cutting at least one of the protective film and the sealing film, and the semiconductor wafer along the dicing street;

wherein preparing the semiconductor wafer comprises preparing a material in which a passivation film is formed on the low dielectric constant film/wiring line stack structure component; and wherein a laser beam is applied before forming the first groove and the second groove, and a laser groove formation preliminary groove is formed in a region corresponding to the predetermined width area of the passivation film in the necessary semiconductor formation region except for the passivation film in the unnecessary semiconductor formation region.

2. The semiconductor device manufacturing method according to claim 1, wherein the predetermined width area in forming the first groove and the second groove has substantially the same width as the dicing street.

3. The semiconductor device manufacturing method according to claim 1, wherein forming the protective film in the second groove formed within the unnecessary semiconductor formation region and on the low dielectric constant film/wiring line stack structure component includes forming the protective film in the first groove around the necessary semiconductor formation region and in the second groove within the unnecessary semiconductor formation region.

4. A semiconductor device manufacturing method comprising:

preparing, on one surface of a semiconductor wafer, a wafer process material, the wafer process material having a plurality of semiconductor formation regions comprising at least a first semiconductor formation region having a first planer size, and a second semiconductor formation region having a second planer size which is different from the first planer size, and the wafer process material including a low dielectric constant film/wiring line stack structure component in which a low dielectric constant film and a wiring line are stacked in each semiconductor formation region;

selecting the first semiconductor formation region as a necessary semiconductor formation region from among the semiconductor formation regions, selecting, as an unnecessary semiconductor formation region, the second semiconductor formation region from among the semiconductor formation regions, in which a dicing street for the necessary semiconductor formation region traverses the second semiconductor formation region, and applying a laser beam to the predetermined width area including the dicing street for the necessary semiconductor formation region and onto a straight extension of the predetermined width area in the wafer process material in order to form a first groove around the dielectric constant film/wiring line stack structure component of the necessary semiconductor formation region and a second groove in an area corresponding to the straight extension within the unnecessary semiconductor formation region;

forming a protective film in at least the second groove formed in the unnecessary semiconductor formation region and on the low dielectric constant film/wiring line stack structure component;

forming, on the protective film in the necessary semiconductor formation region, an upper wiring line connected to the wiring line of the low dielectric constant film/wiring line stack structure component;

forming a sealing film on the low dielectric constant film/wiring line stack structure component and on the upper wiring line within the necessary semiconductor formation region; and cutting at least one of the protective film and the sealing film, and the semiconductor wafer along the dicing street;

wherein forming the protective film in the second groove formed within the unnecessary semiconductor formation region and on the low dielectric constant film/wiring line stack structure component includes forming the protective film in the first groove around the necessary semiconductor formation region and in the second groove within the unnecessary semiconductor formation region, and removing the protective film formed in the first groove within the necessary semiconductor formation region except in the second groove formed within the unnecessary semiconductor formation region to form other grooves.

5. The semiconductor device manufacturing method according to claim 4, wherein forming the upper wiring line connected to the wiring line of the low dielectric constant film/wiring line stack structure component on the protective film in the necessary semiconductor formation region includes forming a foundation metal layer on the protective film, on the side surface of the protective film and on the side surface of the low dielectric constant film/wiring line stack structure component in the necessary semiconductor formation region, and on the protective film in the unnecessary semiconductor formation region.

6. The semiconductor device manufacturing method according to claim 5, wherein forming the upper wiring line connected to the wiring line of the low dielectric constant film/wiring line stack structure component on the protective film in the necessary semiconductor formation region includes forming an upper metal layer on the protective film in the necessary semiconductor formation region except in the protective film in the unnecessary semiconductor formation region.

7. The semiconductor device manufacturing method according to claim 6, wherein forming the upper wiring line connected to the wiring line of the low dielectric constant film/wiring line stack structure component on the protective film in the necessary semiconductor formation region includes removing at least the whole foundation metal layer formed on the protective film in the unnecessary semiconductor formation region.

8. The semiconductor device manufacturing method according to claim 7, wherein forming the upper wiring line connected to the wiring line of the low dielectric constant film/wiring line stack structure component on the protective film in the necessary semiconductor formation region includes forming a columnar electrode on the upper wiring line.

9. The semiconductor device manufacturing method according to claim 7, wherein forming the sealing film on the low dielectric constant film/wiring line stack structure component and on the upper wiring line includes forming the sealing film on the protective film and in the other grooves within the necessary semiconductor formation region, and on the protective film in the unnecessary semiconductor formation region.

10. The semiconductor device manufacturing method according to claim 1, wherein the predetermined width area in forming the first groove and the second groove includes the dicing street and has a width larger than the dicing street.

11. The semiconductor device manufacturing method according to claim 10, wherein preparing the wafer process material is preparing a material in which a passivation film is formed on the low dielectric constant film/wiring line stack structure component.

12. A semiconductor device manufacturing method comprising:
preparing, on one surface of a semiconductor wafer, a wafer process material, the wafer process material having a plurality of semiconductor formation regions comprising at least a first semiconductor formation region having a first planer size, and a second semiconductor formation region having a second planer size which is different from the first planer size, and the wafer process material including a low dielectric constant film/wiring line stack structure component in which a low dielectric constant film and a wiring line are stacked in each semiconductor formation region;
selecting the first semiconductor formation region as a necessary semiconductor formation region from among the semiconductor formation regions, selecting, as an unnecessary semiconductor formation region, the second semiconductor formation region from among the semiconductor formation regions, in which a dicing street for the necessary semiconductor formation region traverses the second semiconductor formation region, and applying a laser beam to a predetermined width area including the dicing street for the necessary semiconductor formation region and onto a straight extension of the predetermined width area in the wafer process material in order to form a first groove around the dielectric constant film/wiring line stack structure component of the necessary semiconductor formation region and a second groove in an area corresponding to the straight extension within the unnecessary semiconductor formation region;
forming a protective film in at least the second groove formed in the unnecessary semiconductor formation region and on the low dielectric constant film/wiring line stack structure component;
forming, on the protective film in the necessary semiconductor formation region, an upper wiring line connected to the wiring line of the low dielectric constant film/wiring line stack structure component;
forming a sealing film on the low dielectric constant film/wiring line stack structure component and on the upper wiring line within the necessary semiconductor formation region; and
cutting at least one of the protective film and the sealing film, and the semiconductor wafer along the dicing street;
wherein the predetermined width area in forming the first groove and the second groove includes the dicing street and has a width larger than the dicing street;
wherein preparing the wafer process material comprises preparing a material in which a passivation film is formed on the low dielectric constant film/wiring line stack structure component; and
wherein, before forming the first groove and the second groove, laser groove formation preliminary grooves of the predetermined width area in the passivation film are formed in the necessary semiconductor formation region except for the passivation film in the unnecessary semiconductor formation region.

13. The semiconductor device manufacturing method according to claim 12, wherein forming the protective film in the second groove formed within the unnecessary semiconductor formation region and on the low dielectric constant film/wiring line stack structure component includes forming the protective film in the first groove within the necessary semiconductor formation region and in the second groove within the unnecessary semiconductor formation region.

14. A semiconductor device manufacturing method comprising:
preparing, on one surface of a semiconductor wafer, a wafer process material, the wafer process material having a plurality of semiconductor formation regions comprising at least a first semiconductor formation region having a first planer size, and a second semiconductor formation region having a second planer size which is different from the first planer size, and the wafer process material including a low dielectric constant film/wiring line stack structure component in which a low dielectric constant film and a wiring line are stacked in each semiconductor formation region;
selecting the first semiconductor formation region as a necessary semiconductor formation region from among the semiconductor formation regions, selecting, as an unnecessary semiconductor formation region, the second semiconductor formation region from among the semiconductor formation regions, in which a dicing street for the necessary semiconductor formation region traverses the second semiconductor formation region, and applying a laser beam to the predetermined width area including the dicing street for the necessary semiconductor formation region and onto a straight extension of the predetermined width area in the wafer process material in order to form a first groove around the dielectric constant film/wiring line stack structure component of the necessary semiconductor formation region and a second groove in an area corresponding to the straight extension within the unnecessary semiconductor formation region;

forming a protective film in at least the second groove formed in the unnecessary semiconductor formation region and on the low dielectric constant film/wiring line stack structure component;

forming, on the protective film in the necessary semiconductor formation region, an upper wiring line connected to the wiring line of the low dielectric constant film/wiring line stack structure component;

forming a sealing film on the low dielectric constant film/wiring line stack structure component and on the upper wiring line within the necessary semiconductor formation region; and cutting at least one of the protective film and the sealing film, and the semiconductor wafer along the dicing street;

wherein the predetermined width area in forming the first groove and the second groove includes the dicing street and has a width larger than the dicing street; and wherein forming the protective film in the second groove formed within the unnecessary semiconductor formation region and on the low dielectric constant film/wiring line stack structure component includes forming the protective film in the first groove within the necessary semiconductor formation region and in the second groove within the unnecessary semiconductor formation region, and removing the protective film formed in the first groove within the necessary semiconductor formation region except in the second groove formed within the unnecessary semiconductor formation region to form another groove.

15. The semiconductor device manufacturing method according to claim 14, wherein forming the upper wiring line connected to the wiring line of the low dielectric constant film/wiring line stack structure component on the protective film in the necessary semiconductor formation region includes forming a foundation metal layer on the protective film, on the side surface of the protective film and on the side surface of the low dielectric constant film/wiring line stack structure component in the necessary semiconductor formation region, and on the protective film in the unnecessary semiconductor formation region.

16. The semiconductor device manufacturing method according to claim 15, wherein forming the upper wiring line connected to the wiring line of the low dielectric constant film/wiring line stack structure component on the protective film in the necessary semiconductor formation region includes forming an upper metal layer on the protective film in the necessary semiconductor formation region except in the protective film in the unnecessary semiconductor formation region.

17. The semiconductor device manufacturing method according to claim 16, wherein forming the sealing film on the low dielectric constant film/wiring line stack structure component and on the upper wiring line includes forming the sealing film in the groove within the necessary semiconductor formation region.

18. The semiconductor device manufacturing method according to claim 17, wherein cutting the at least one of the protective film and the sealing film, and the semiconductor wafer along the dicing street is cutting the sealing film and the semiconductor wafer at the width of the dicing street smaller than the width of the predetermined width area.

19. The semiconductor device manufacturing method according to claim 16, wherein forming the sealing film on the low dielectric constant film/wiring line stack structure component and on the upper wiring line includes forming the sealing film in the groove within the necessary semiconductor formation region.

20. The semiconductor device manufacturing method according to claim 19, wherein cutting at least one of the protective film and the sealing film, and the semiconductor wafer along the dicing street is cutting the sealing film and the semiconductor wafer at the width of the dicing street smaller than the width of the predetermined width area.

21. The semiconductor device manufacturing method according to claim 13, wherein forming the sealing film on the low dielectric constant film/wiring line stack structure component and on the upper wiring line includes forming the sealing film on the protective film in the necessary semiconductor formation region and on the protective film in the unnecessary semiconductor formation region.

22. The semiconductor device manufacturing method according to claim 21, wherein cutting the at least one of the protective film and the sealing film, and the semiconductor wafer along the dicing street is cutting the sealing film, the protective film and the semiconductor wafer at the width of the dicing street smaller than the width of the predetermined width area.

* * * * *